United States Patent
Blanchard et al.

(10) Patent No.: US 11,237,103 B2
(45) Date of Patent: Feb. 1, 2022

(54) ELECTRONIC DEVICE TESTING SYSTEM, ELECTRONIC DEVICE PRODUCTION SYSTEM INCLUDING SAME AND METHOD OF TESTING AN ELECTRONIC DEVICE

(71) Applicant: SOCOVAR SEC, Montreal (CA)

(72) Inventors: François Blanchard, Montréal (CA); Mariia Zhuldybina, Montréal (CA)

(73) Assignee: SOCOVAR SEC, Montreal (CA)

( * ) Notice: Subject to any disclaimer, the term of this patent is extended or adjusted under 35 U.S.C. 154(b) by 0 days.

(21) Appl. No.: 17/059,538

(22) PCT Filed: May 30, 2019

(86) PCT No.: PCT/CA2019/050743
§ 371 (c)(1),
(2) Date: Nov. 30, 2020

(87) PCT Pub. No.: WO2019/227220
PCT Pub. Date: Dec. 5, 2019

(65) Prior Publication Data
US 2021/0208065 A1    Jul. 8, 2021

Related U.S. Application Data

(60) Provisional application No. 62/678,479, filed on May 31, 2018.

(51) Int. Cl.
*G01N 21/3581* (2014.01)
*H05K 1/02* (2006.01)

(52) U.S. Cl.
CPC ....... *G01N 21/3581* (2013.01); *H05K 1/0269* (2013.01)

(58) Field of Classification Search
CPC .... H01Q 21/12; G01J 3/4338; G01N 21/3581
See application file for complete search history.

(56) References Cited

U.S. PATENT DOCUMENTS

| 4,401,686 A | 8/1983 | Durand |
| 6,310,346 B1 * | 10/2001 | Boreman ............ G01J 5/08 250/338.1 |

(Continued)

FOREIGN PATENT DOCUMENTS

| CN | 103619129 A | 3/2015 |
| CN | 103762095 B | 3/2015 |

(Continued)

OTHER PUBLICATIONS

Withayachumnankul, Withawat, and Derek Abbott. "Metamaterials in the terahertz regime. " IEEE Photonics Journal 1.2 (2009): 99-118.

(Continued)

*Primary Examiner* — David P Porta
*Assistant Examiner* — Djura Malevic
(74) *Attorney, Agent, or Firm* — Norton Rose Fulbright Canada LLP

(57) ABSTRACT

There is described an electronic device testing system for testing an electronic device having a substrate on which is printed a metamaterial structure using an ink. The electronic device testing system generally has: a terahertz radiation emitter configured to emit an incident terahertz radiation beam to be incident on the metamaterial structure of the substrate, the incident terahertz radiation beam having power at least at the terahertz resonance frequency of the metamaterial structure; a terahertz radiation receiver configured to receive an outgoing terahertz radiation beam outgoing from the metamaterial structure and to measure an amplitude of an electric field of the outgoing terahertz radiation beam at least at the terahertz resonance frequency; and a controller configured to determine a conductivity value indicative of a conductivity of the ink based on said (Continued)

amplitude of the electric field of the outgoing terahertz radiation beam.

19 Claims, 19 Drawing Sheets

(56) References Cited

U.S. PATENT DOCUMENTS

| | | | |
|---|---|---|---|
| 6,573,737 B1 | 6/2003 | Lyon et al. | |
| 6,933,112 B1* | 8/2005 | Drewes | G01N 21/7703 435/6.11 |
| 6,992,829 B1* | 1/2006 | Jennings | G02B 6/2861 359/298 |
| 7,381,955 B2* | 6/2008 | Watanabe | G01N 21/3581 250/341.8 |
| 7,876,423 B1 | 1/2011 | Roth | |
| 8,017,915 B2* | 9/2011 | Mazin | A61B 6/54 250/363.04 |
| 8,115,683 B1* | 2/2012 | Stefanakos | H01Q 1/248 343/700 MS |
| 8,284,102 B2* | 10/2012 | Hayes | H01Q 25/00 342/374 |
| 8,350,759 B2* | 1/2013 | Ju | H01Q 15/0086 343/700 MS |
| 8,816,282 B2* | 8/2014 | Thiel | G01J 5/20 250/338.1 |
| 8,848,273 B2* | 9/2014 | Yu | G02B 1/002 359/238 |
| 8,912,973 B2* | 12/2014 | Werner | H01Q 15/02 343/853 |
| 8,921,789 B2* | 12/2014 | Pryce | G01N 21/3581 250/338.1 |
| 9,000,994 B2* | 4/2015 | Shylo | H01Q 5/22 343/760 |
| 9,030,286 B2 | 5/2015 | Hor et al. | |
| 9,108,358 B1 | 8/2015 | Herloski et al. | |
| 9,140,742 B2 | 9/2015 | Voronov et al. | |
| 9,190,736 B1* | 11/2015 | Burckel | H01L 51/0008 |
| 9,244,004 B2 | 1/2016 | Barychev et al. | |
| 9,366,576 B2* | 6/2016 | Hwang | G01J 5/28 |
| 9,488,572 B2* | 11/2016 | Sertel | G01R 31/2822 |
| 9,502,780 B2* | 11/2016 | Chau | H01Q 9/285 |
| 9,507,064 B2* | 11/2016 | Brongersma | G02B 1/002 |
| 9,683,928 B2* | 6/2017 | Swanson | G01B 9/02051 |
| 9,733,545 B2* | 8/2017 | Belkin | G02F 1/3501 |
| 9,739,710 B2* | 8/2017 | Schubert | G01N 21/23 |
| 9,804,577 B1 | 10/2017 | Troy et al. | |
| 9,812,786 B2* | 11/2017 | Foo | H01Q 15/10 |
| 9,927,517 B1* | 3/2018 | Bennett | G01S 13/88 |
| 9,927,559 B2* | 3/2018 | Li | G02B 5/0257 |
| 9,952,557 B2* | 4/2018 | Shaltout | G02B 1/00 |
| 9,954,286 B2* | 4/2018 | Henry | H04B 1/40 |
| 9,960,808 B2* | 5/2018 | Henry | H01P 3/16 |
| 9,995,859 B2* | 6/2018 | Kamali | G02B 27/4211 |
| 10,069,535 B2* | 9/2018 | Vannucci | H04B 3/58 |
| 10,126,466 B2* | 11/2018 | Lin | G02B 5/00 |
| 10,131,127 B2* | 11/2018 | Mutzel | B32B 38/145 |
| 10,161,797 B2* | 12/2018 | Shaltout | G01J 3/2803 |
| 10,205,231 B1* | 2/2019 | Henry | H01Q 21/205 |
| 10,288,563 B1* | 5/2019 | Ahmadivand | G01N 33/54373 |
| 10,310,287 B2* | 6/2019 | Ellenbogen | G02B 5/008 |
| 10,324,314 B2* | 6/2019 | Czaplewski | G02F 1/01 |
| 10,355,368 B2* | 7/2019 | AlShareef | H01Q 1/248 |
| 10,459,258 B2* | 10/2019 | Baik | G06F 30/398 |
| 10,535,928 B2* | 1/2020 | Henry | H01Q 15/08 |
| 10,547,116 B2* | 1/2020 | Pitsillides | H01Q 15/002 |
| 10,547,350 B2* | 1/2020 | Cook | H04B 5/0031 |
| 10,562,024 B2* | 2/2020 | Omenetto | G01N 21/3581 |
| 10,580,611 B2* | 3/2020 | Andreev | H03F 3/58 |
| 10,581,522 B1* | 3/2020 | Innes | H04B 10/11 |
| 10,620,431 B2* | 4/2020 | Yu | H01Q 21/0087 |
| 10,620,444 B2* | 4/2020 | Kumkar | B23K 26/0622 |
| 10,661,384 B2* | 5/2020 | Kumkar | G02B 5/1871 |
| 10,670,782 B2* | 6/2020 | Arbabi | G02B 27/0056 |
| 10,727,599 B2* | 7/2020 | Wolniansky | H01Q 13/085 |
| 10,760,970 B2* | 9/2020 | Shaltout | G01J 3/2803 |
| 10,820,283 B2* | 10/2020 | Davlantes | H02J 50/20 |
| 10,838,129 B2* | 11/2020 | Lee | G02B 6/001 |
| 10,882,143 B2* | 1/2021 | Kumkar | B23K 26/53 |
| 10,931,004 B2* | 2/2021 | Yoo | H01Q 21/062 |
| 11,035,548 B2* | 6/2021 | Han | G02B 5/1809 |
| 11,070,269 B2* | 7/2021 | Lee | H04B 7/0617 |
| 11,088,458 B2* | 8/2021 | Jafargholi | H01Q 1/38 |
| 11,112,305 B2* | 9/2021 | Jarrahi | G01J 3/108 |
| 11,128,345 B2* | 9/2021 | Cook | H04B 5/0075 |
| 2004/0208589 A1* | 10/2004 | Hobbs | G02B 6/4214 398/115 |
| 2005/0073744 A1* | 4/2005 | Zheludev | G02F 1/0102 359/486.03 |
| 2005/0168339 A1* | 8/2005 | Arai | G06K 19/07749 340/572.8 |
| 2006/0085160 A1* | 4/2006 | Ouchi | H01Q 1/36 702/150 |
| 2006/0231625 A1* | 10/2006 | Cumming | G07D 7/0032 235/454 |
| 2007/0109177 A1* | 5/2007 | Baath | G01S 13/88 342/124 |
| 2008/0001843 A1* | 1/2008 | Wu | H01Q 1/405 343/873 |
| 2008/0198453 A1* | 8/2008 | LaFontaine | G02B 5/3075 359/485.01 |
| 2009/0230333 A1* | 9/2009 | Eleftheriades | G02B 27/58 250/505.1 |
| 2009/0256078 A1* | 10/2009 | Mazin | A61B 6/0407 250/362 |
| 2010/0002324 A1* | 1/2010 | Rozhin | C08J 5/005 359/896 |
| 2010/0054105 A1* | 3/2010 | Handa | G02B 5/008 369/112.01 |
| 2010/0253997 A1* | 10/2010 | Li | G02F 1/292 359/319 |
| 2011/0019190 A1 | 1/2011 | Sakai et al. | |
| 2011/0031400 A1* | 2/2011 | Sartorius | G01N 21/3581 250/338.4 |
| 2011/0199273 A1* | 8/2011 | Kim | H01Q 15/02 343/753 |
| 2011/0227804 A1* | 9/2011 | Nilsson | H01Q 19/106 343/840 |
| 2012/0113502 A1* | 5/2012 | Suh | B81C 1/00111 359/346 |
| 2013/0169499 A1* | 7/2013 | Lin | H01Q 13/24 343/776 |
| 2013/0208332 A1* | 8/2013 | Yu | G02B 1/002 359/240 |
| 2013/0344290 A1* | 12/2013 | Yu | C09D 7/67 428/142 |
| 2014/0085693 A1* | 3/2014 | Mosallaei | G06E 3/00 359/107 |
| 2014/0154788 A1* | 6/2014 | Omenetto | C12Q 1/54 435/287.2 |
| 2014/0266958 A1* | 9/2014 | Doskocil | H01Q 21/26 343/848 |
| 2014/0268168 A1 | 9/2014 | Feldman et al. | |
| 2014/0375512 A1* | 12/2014 | Knap | G01J 3/42 343/703 |
| 2015/0041658 A1 | 2/2015 | Chun et al. | |
| 2015/0102225 A1* | 4/2015 | Sertel | G01R 31/2822 250/341.5 |
| 2015/0151525 A1* | 6/2015 | Mutzel | H01Q 15/0086 428/174 |
| 2015/0192721 A1* | 7/2015 | El-Kady | G02B 5/3083 359/352 |
| 2015/0201186 A1* | 7/2015 | Smithwick | G03H 1/2294 348/52 |
| 2015/0288048 A1 | 10/2015 | Tang et al. | |
| 2015/0309218 A1* | 10/2015 | Shalaev | G02B 1/002 359/241 |
| 2015/0331167 A1* | 11/2015 | Escuti | G02B 5/32 359/3 |

(56) References Cited

U.S. PATENT DOCUMENTS

| | | | | |
|---|---|---|---|---|
| 2015/0349910 A1* | 12/2015 | Huang | H04J 14/00 | 398/44 |
| 2016/0025914 A1* | 1/2016 | Brongersma | G02B 1/002 | 359/489.07 |
| 2016/0028163 A1* | 1/2016 | Li | H01Q 19/17 | 343/836 |
| 2016/0056005 A1* | 2/2016 | Andreev | B22F 10/20 | 315/39.3 |
| 2016/0056966 A1* | 2/2016 | Bell | G06F 1/1635 | 713/310 |
| 2016/0084702 A1* | 3/2016 | Tomioka | G01J 3/42 | 250/338.3 |
| 2016/0099758 A1* | 4/2016 | Bell | H02J 7/025 | 307/104 |
| 2016/0131585 A1* | 5/2016 | Xiong | G01N 21/658 | 436/74 |
| 2016/0150648 A1 | 5/2016 | De Vaan | | |
| 2016/0259175 A1* | 9/2016 | Ellenbogen | G02B 5/30 | |
| 2016/0306079 A1* | 10/2016 | Arbabi | G02B 27/0025 | |
| 2016/0349769 A1 | 12/2016 | Lee | | |
| 2016/0379753 A1* | 12/2016 | Jang | H01F 38/14 | 703/1 |
| 2017/0003116 A1 | 1/2017 | Yee et al. | | |
| 2017/0077736 A1* | 3/2017 | Leabman | H02J 50/80 | |
| 2017/0097558 A1* | 4/2017 | Belkin | G02F 1/37 | |
| 2017/0110804 A1* | 4/2017 | Henry | H01Q 13/02 | |
| 2017/0122720 A1 | 5/2017 | Feldman et al. | | |
| 2017/0123291 A1* | 5/2017 | Vampa | G02F 1/353 | |
| 2017/0131460 A1* | 5/2017 | Lin | G02B 6/005 | |
| 2017/0163451 A1* | 6/2017 | Willner | H04L 25/03891 | |
| 2017/0276841 A1* | 9/2017 | Li | G02B 6/13 | |
| 2017/0324446 A1* | 11/2017 | Cook | H04B 5/0075 | |
| 2017/0346565 A1* | 11/2017 | Dawson | H04B 10/1129 | |
| 2017/0366242 A1* | 12/2017 | Lee | H04B 7/0408 | |
| 2018/0115075 A1* | 4/2018 | Bennett | H01Q 1/50 | |
| 2018/0159228 A1* | 6/2018 | Britz | H01Q 13/02 | |
| 2018/0159243 A1* | 6/2018 | Britz | H01Q 19/193 | |
| 2018/0160304 A1* | 6/2018 | Liu | H01P 3/16 | |
| 2018/0167148 A1* | 6/2018 | Vannucci | H01Q 13/28 | |
| 2018/0167927 A1* | 6/2018 | Beattie, Jr. | H04W 4/029 | |
| 2018/0217395 A1* | 8/2018 | Lin | G02B 1/002 | |
| 2018/0252857 A1* | 9/2018 | Glik | G02B 1/002 | |
| 2018/0278334 A1* | 9/2018 | Ashrafi | H04B 10/532 | |
| 2018/0287262 A1* | 10/2018 | Patri | H01Q 13/02 | |
| 2018/0306716 A1* | 10/2018 | Ashrafi | G01N 21/636 | |
| 2018/0308259 A1* | 10/2018 | Kimura | G01N 22/02 | |
| 2018/0323511 A1* | 11/2018 | Urzhumov | H01Q 1/2225 | |
| 2019/0044246 A1* | 2/2019 | Pitsillides | H01Q 3/46 | |
| 2019/0103665 A1* | 4/2019 | Yoo | H01Q 15/0086 | |
| 2019/0173190 A1* | 6/2019 | Johnson | H01Q 13/24 | |
| 2019/0265498 A1* | 8/2019 | Ellenbogen | G02B 27/4211 | |
| 2020/0111925 A1* | 4/2020 | Jarrahi | H01L 31/022408 | |
| 2020/0162127 A1* | 5/2020 | Cook | H01P 5/107 | |
| 2020/0169969 A1* | 5/2020 | Davlantes | H04W 52/283 | |
| 2020/0284960 A1* | 9/2020 | Ellenbogen | G02B 1/002 | |
| 2020/0404597 A1* | 12/2020 | Davlantes | H02J 50/20 | |
| 2021/0141285 A1* | 5/2021 | Marandi | G02F 1/39 | |

FOREIGN PATENT DOCUMENTS

| | | |
|---|---|---|
| CN | 104993199 A | 10/2015 |
| CN | 106793568 A | 5/2017 |
| KR | 20140014530 A | 2/2014 |
| KR | 20150004147 A | 1/2015 |
| KR | 20170128954 A | 11/2017 |
| WO | 2016/198690 A1 | 12/2016 |
| WO | 2017/175215 A1 | 10/2017 |
| WO | 2017/203020 A1 | 11/2017 |
| WO | 2018/043438 A1 | 3/2018 |
| WO | 2018/045779 A1 | 3/2018 |

OTHER PUBLICATIONS

Zeng, Yang, et al. "Terahertz characterisation of UV offset lithographically printed electronic-ink." Organic Electronics 48 (2017): 382-388.

Hokari, Ryohei, et al. "Printed optical metamaterials composed of embedded silver nanoparticles for flexible applications." Optics express 26.8 (2018): 10326-10338.

* cited by examiner

TERAHERTZ RESONANCE FREQUENCY

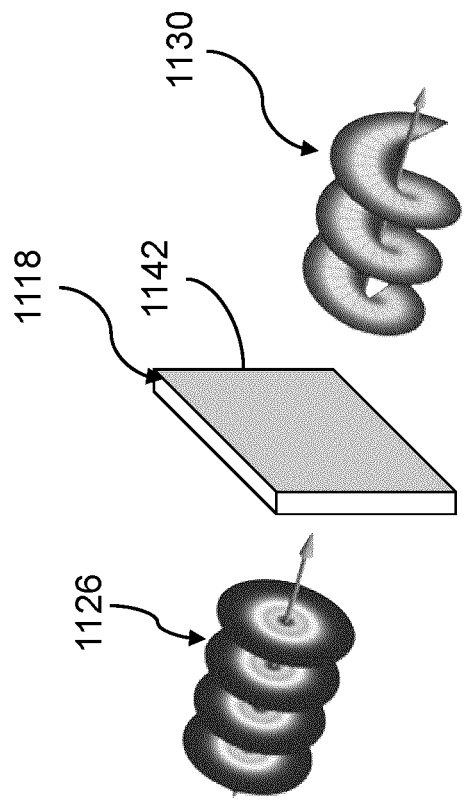
Fig. 12
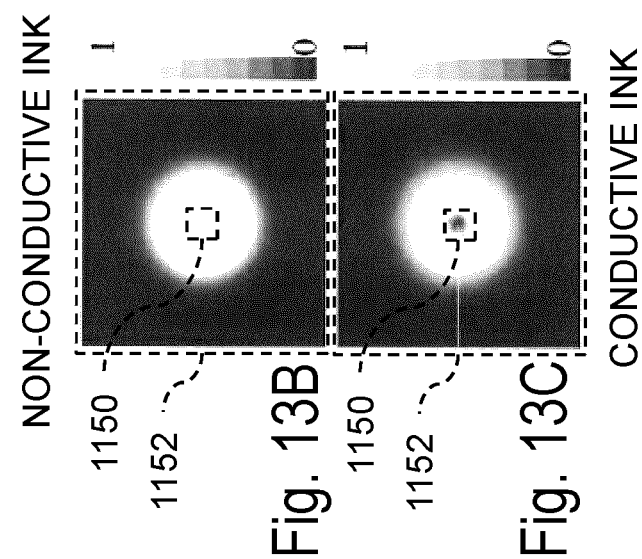
Fig. 13B
Fig. 13C
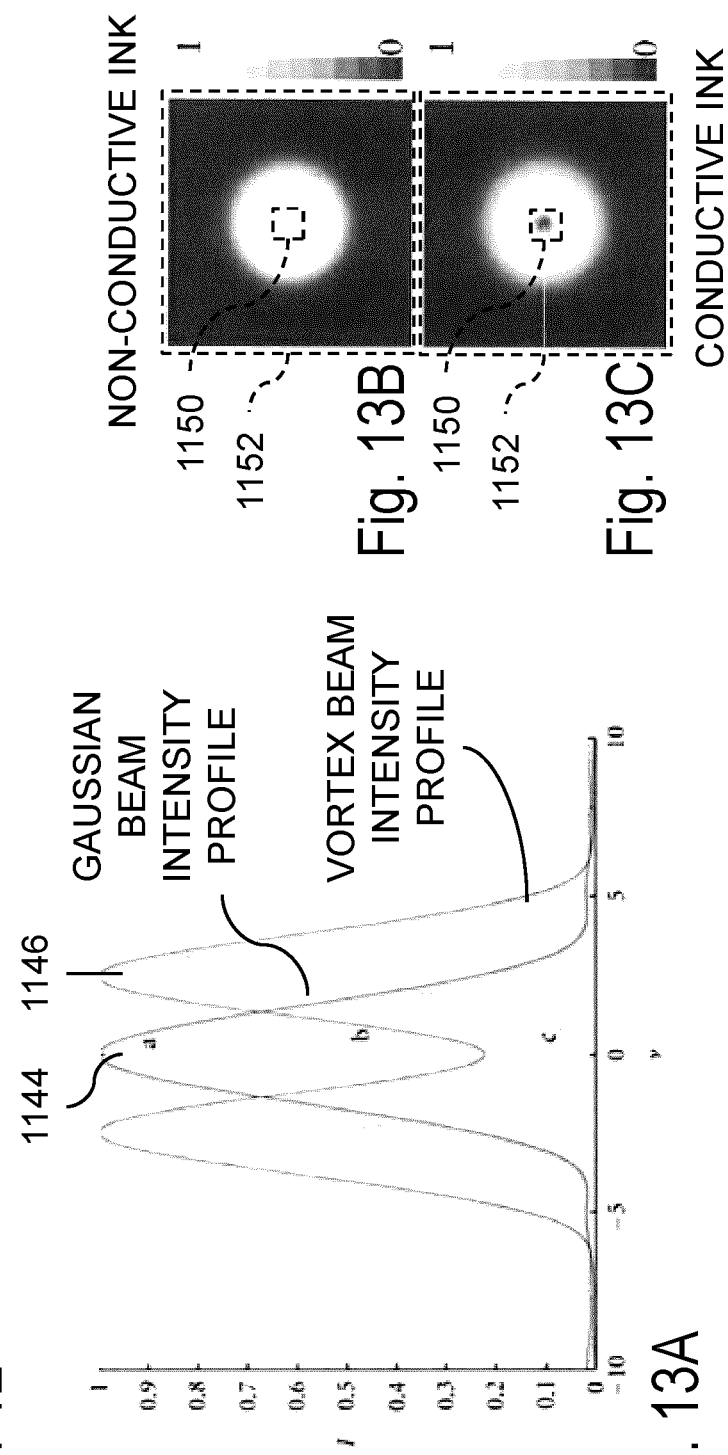
Fig. 13A

| Sintering Time | Not Sintered | 0.03 s/mm | 0.05 s/mm | 0.07 s/mm | 0.2 s/mm |
|---|---|---|---|---|---|
| 4PP | 1.15 ± 4.70% | 1.31 ± 4.47% | 1.42 ± 10.3% | 2.61 ± 8.67% | 2.77 ± 9.82% |
| MM | 1.10 ± 21.1% | 1.19 ± 12.1% | 1.48 ± 17.9% | 2.15 ± 22.2% | 3.01 ± 36.7% |
| 2MP | 1.23 ± 6.59% | 1.28 ± 8.44% | 1.49 ± 8.73% | 2.29 ± 6.83% | 2.51 ± 7.58% |
| THz-TDS | 1.08 ± 6.14% | 1.38 ± 3.06% | 1.75 ± 1.55% | 2.14 ± 2.52% | 2.91 ± 2.77% |
| DWTS | 1.06 ± 3.44% | 1.37 ± 1.28% | 1.78 ± 1.21% | 2.18 ± 1.44% | 2.89 ± 1.80% |
| AFM |  |  |  |  | |

Conductivity, ×10⁶ S/m Obtained by

ELECTRONIC DEVICE TESTING SYSTEM, ELECTRONIC DEVICE PRODUCTION SYSTEM INCLUDING SAME AND METHOD OF TESTING AN ELECTRONIC DEVICE

FIELD

The improvements generally relate to the field of printed electronic devices and more specifically relate to control such printed electronic devices.

BACKGROUND

Printed electronic devices are typically made from substrates on which electronic circuits are printed. As can be understood, printing of an electronic device generally involves depositing conductive ink on a substrate in a predetermined pattern to form conductive traces. The printing of such electronic circuits can be performed using conventional printing techniques suitable for defining patterns on substrates, such as screen printing, flexography, gravure, offset lithography, inkjet, sintering and the like. Printed electronic techniques enable for low-cost fabrication and large-volume production of electronic devices for applications such as flexible displays to name only one example.

As with any other production process, testing of some or all of the electronic devices during the production process is key in achieving a satisfactory production process. For instance, if the conductivity of the ink used in the printing technique varies below a given conductivity threshold over time, the operability of the resulting printed electronic devices could be negatively affected. As such, one technique to test the conductivity of the ink of a printed electronic device involves contacting measurement probes on the conductive traces to make a direct conductivity measurement at some point in the production process. However, such a testing technique can provide conductivity measurements which are limited in resolution. Moreover, this testing technique requires a physical contact of the traces, which can cause irreparable damage to the printed electronic device in at least some situations.

Although existing testing techniques are satisfactory to a certain degree, there remains room for improvement, especially in providing printed electronic device testing systems and methods which alleviate at least some of the above-mentioned drawbacks.

SUMMARY

In accordance with a first embodiment of the present disclosure, there is provided an electronic device testing system for testing an electronic device having a substrate on which a metamaterial structure is printed using an ink, the electronic device testing system comprising: a terahertz radiation emitter configured to emit an incident terahertz radiation beam to be incident on the metamaterial structure of the substrate, the incident terahertz radiation beam having power at least at the terahertz resonance frequency of the metamaterial structure; a terahertz radiation receiver configured to receive an outgoing terahertz radiation beam outgoing from the metamaterial structure and to measure an amplitude of an electric field of the outgoing terahertz radiation beam at least at the terahertz resonance frequency; and a controller configured to determine a conductivity value indicative of a conductivity of the ink based on said amplitude of the electric field of the outgoing terahertz radiation beam. In some embodiments, the controller can also be configured to generate a signal indicative of an action to be performed when the determined conductivity of the ink is below a given conductivity threshold.

Further in accordance with the first embodiment, the terahertz radiation emitter is for example a broadband terahertz radiation emitter, the terahertz radiation receiver being configured to measure a spectral power distribution of the outgoing terahertz radiation beam, the system further comprising a broadband terahertz radiation reference receiver configured to measure a spectral power distribution of a portion of the incident terahertz radiation beam, the controller being configured to determine the conductivity value based on the spectral power distribution of the incident terahertz radiation beam and on the spectral power distribution of the outgoing terahertz radiation beam.

Still further in accordance with the first embodiment, the terahertz radiation emitter is for example a broadband terahertz radiation emitter, the terahertz radiation receiver being configured to measure a spectral power distribution of the outgoing terahertz radiation beam, the controller being configured to determine the conductivity value based on an amplitude of a first spectral region including the terahertz resonance frequency and on an amplitude of a second spectral region being spectrally spaced-apart from the first spectral region.

Still further in accordance with the first embodiment, the metamaterial structure is for example provided in the form of a vortex phase plate.

Still further in accordance with the first embodiment, the terahertz radiation receiver is for example a terahertz radiation image receiver, the controller being configured to determine the conductivity value based on an amplitude of the electric field of the outgoing terahertz radiation beam at a central region thereof.

Still further in accordance with the first embodiment, the terahertz radiation emitter and the terahertz radiation receiver are for example complementary metal-oxide-semiconductor devices, the electronic device testing system being portable.

In accordance with a second embodiment of the present disclosure, there is provided an electronic device production system comprising: an electronic device printing system configured to print an electronic device including receiving a substrate, printing an electronic circuit on a given area of the substrate using an ink and printing a metamaterial structure on a remaining area of the substrate using the ink, the metamaterial structure comprising a pattern of elements providing a resonance at a terahertz frequency (hereinafter "the terahertz resonance frequency") to the metamaterial structure; and an electronic device testing system being adapted to receive the previously printed substrate, the electronic device testing system comprising a terahertz radiation emitter configured to emit an incident terahertz radiation beam to be incident on the metamaterial structure of the substrate, the incident terahertz radiation beam having power at least at the terahertz resonance frequency of the metamaterial structure, a terahertz radiation receiver configured to receive an outgoing terahertz radiation beam outgoing from the metamaterial structure and to measure an amplitude of an electric field of the outgoing terahertz radiation beam at least at the terahertz resonance frequency; and a controller configured to determine a conductivity value indicative of a conductivity of the ink based on said amplitude and to generate a signal indicative of an action to be performed when the determined conductivity of the ink is below a given conductivity threshold.

Further in accordance with the second embodiment, said action includes for example generating a file indicating that the electronic device has been printed with ink having a conductivity value being below the given conductivity threshold.

Still further in accordance with the second embodiment, said action includes for example modifying at least one printing parameter of said electronic device printing system.

Still further in accordance with the second embodiment, said action includes for example one of partially and wholly reprinting the electronic circuit of the electronic device after said modifying.

In accordance with a third embodiment of the present disclosure, there is provided a method for testing an electronic device having an electronic circuit being printed on a given area of a substrate using an ink and a metamaterial structure being printed on a remaining area of the substrate, the metamaterial structure comprising a pattern of elements providing a terahertz resonance frequency to the metamaterial structure using the ink, the method comprising: emitting a terahertz radiation emitter incident on the metamaterial structure of the substrate, the incident terahertz radiation beam having power at least at the terahertz resonance frequency of the metamaterial structure, thereby causing an outgoing terahertz radiation beam to be outgoing from the metamaterial structure; the metamaterial structure modifying a first spectral power distribution of the incident terahertz beam and thereby causing an outgoing terahertz radiation beam to have a second spectral power distribution being different from the first spectral power distribution; measuring an amplitude of an electric field of the outgoing terahertz radiation beam at least at the terahertz resonance frequency; and using a controller being communicatively coupled to at least the terahertz radiation receiver, determining a conductivity value indicative of a conductivity of the ink based on said amplitude.

Further in accordance with the third embodiment, the incident terahertz radiation beam for example is a broadband terahertz radiation beam, said measuring including measuring a spectral power distribution of the outgoing terahertz radiation beam, the method further comprising measuring a spectral power distribution of a portion of the incident terahertz radiation beam, said determining including determining the conductivity value based on the spectral power distribution of the incident terahertz radiation beam and on the spectral power distribution of the outgoing terahertz radiation beam.

Still further in accordance with the third embodiment, the terahertz radiation beam for example is a broadband terahertz radiation beam, said measuring including measuring a spectral power distribution of the outgoing terahertz radiation beam, said determining comprising determining the conductivity value based on an amplitude of a first spectral region including the terahertz resonance frequency and on an amplitude of a second spectral region being spectrally spaced-apart from the first spectral region.

Still further in accordance with the third embodiment, the metamaterial structure is for example provided in the form of a vortex phase plate, said measuring including measuring an image of the outgoing terahertz radiation beam, said determining comprising determining the conductivity value based on an amplitude of the electric field of the outgoing terahertz radiation beam at a central region thereof.

Still further in accordance with the third embodiment, upon determining that the conductivity value is lower than a conductivity value threshold, generating for example a signal indicative of an action to be performed.

Still further in accordance with the third embodiment, said action including for example generating a file indicating that the electronic device has been printed with unsatisfactory ink.

Still further in accordance with the third embodiment, upon determining that the conductivity value is lower than a conductivity value threshold, updating for example current printing parameters to updated printing parameters based on said determined conductivity value.

Still further in accordance with the third embodiment, reprinting for example the electronic circuit on the given area of the substrate based on said updated printing parameters. In some embodiments, the updated printing parameters are used to print subsequent electronic devices only. The electronic device printed with unsatisfactory ink need not be reprinted, as it may be discarded in at least some situations.

Still further in accordance with the third embodiment, printing for example the metamaterial structure on the remaining area of the substrate using the ink.

It will be understood that the expression "computer" as used herein is not to be interpreted in a limiting manner. It is rather used in a broad sense to generally refer to the combination of some form of one or more processing units and some form of memory system accessible by the processing unit(s). Similarly, the expression "controller" as used herein is not to be interpreted in a limiting manner but rather in a general sense of a device, or of a system having more than one device, performing the function(s) of controlling one or more devices such as an electronic device, for instance.

It will be understood that the various functions of a computer or of a controller can be performed by hardware or by a combination of both hardware and software. For example, hardware can include logic gates included as part of a silicon chip of the processor. Software can be in the form of data such as computer-readable instructions stored in the memory system. With respect to a computer, a controller, a processing unit, or a processor chip, the expression "configured to" relates to the presence of hardware or a combination of hardware and software which is operable to perform the associated functions.

The term "amplitude" is used broadly herein so as to encompass terms such as "intensity," "irradiance" and the like.

Many further features and combinations thereof concerning the present improvements will appear to those skilled in the art following a reading of the instant disclosure.

DESCRIPTION OF THE FIGURES

In the figures,

FIG. 12 is an oblique view of the vortex phase plate of FIG. 11, showing incident and outgoing terahertz radiation beams, in accordance with one or more embodiments;

FIG. 13A is a graph showing spatial distributions of the incident and outgoing terahertz radiation beams of FIG. 12, in accordance with one or more embodiments;

FIG. 13B is an example of an image produced by the monochromatic broadband terahertz radiation image receiver of FIG. 11 when the ink used to print the vortex phase plate of FIG. 12 is not satisfactorily conductive and/or or non-conductive, in accordance with one or more embodiments;

FIG. 13C is an example of an image produced by the monochromatic broadband terahertz radiation image receiver of FIG. 11 when the ink used to print the vortex phase plate of FIG. 12 is satisfactorily conductive, in accordance with one or more embodiments;

DETAILED DESCRIPTION

Figure 1:
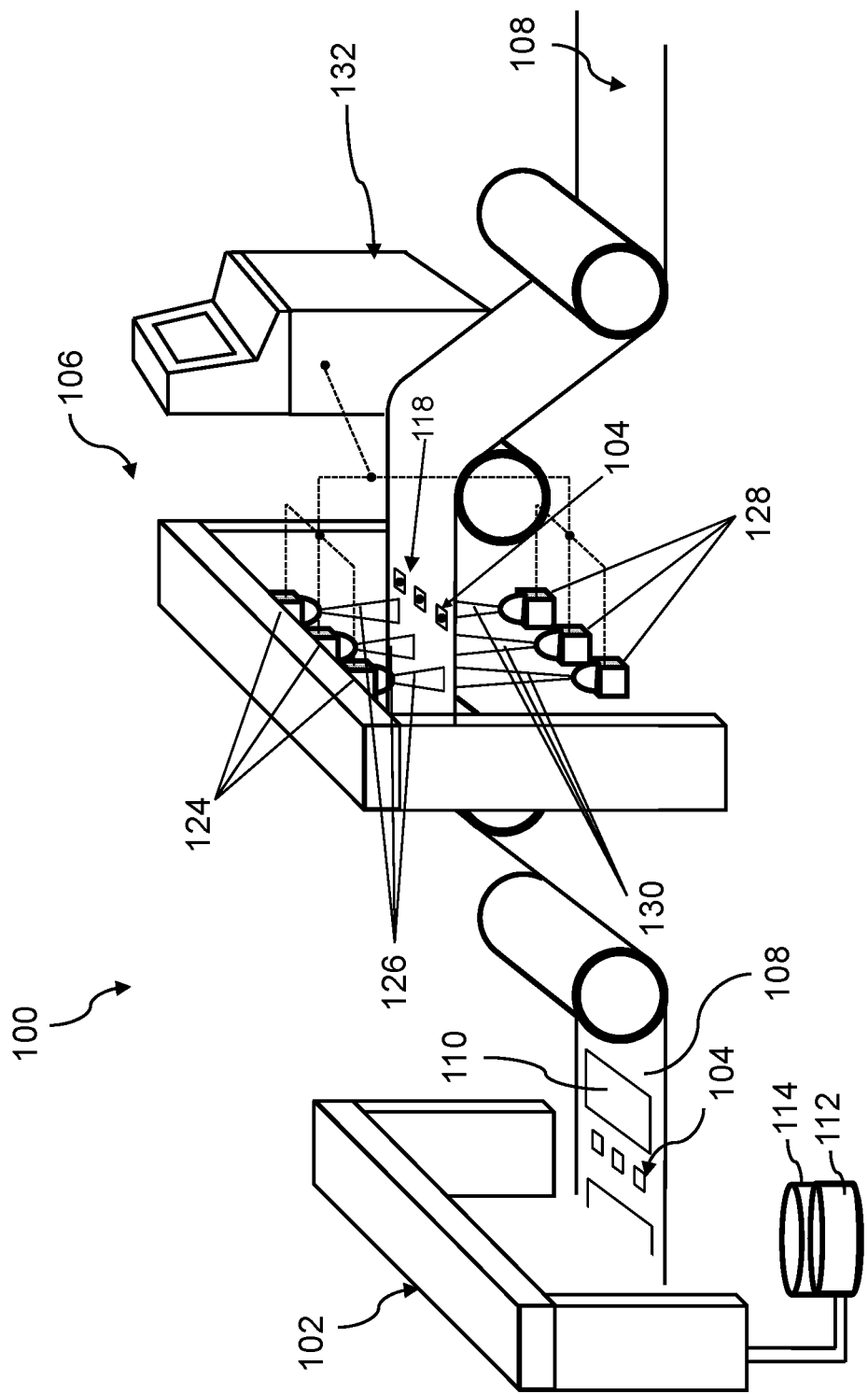
FIG. 1 is a schematic view of an example of an electronic device production system including an electronic device printing system, an electronic device testing system and a controller, in accordance with one or more embodiments.

FIG. 1 shows an example of an electronic device production system 100, in accordance with one or more embodiments. As depicted in this specific example, the electronic device production system 100 has an electronic device printing system 102 for printing electronic devices 104. An electronic device testing system 106 is also provided for testing the previously printed electronic devices 104.

In this example, the electronic device printing system 102 is configured to receive a substrate 108 and to print an electronic circuit 110 thereon using conductive ink according to conventional printing techniques. For instance, in this specific embodiment, the electronic device printing system 102 is configured to draw ink 112 from an ink reservoir 114 and to deposit the ink 112 in predetermined patterns on the substrate 108 to form the electronic circuit 110.

In this specific embodiment, the ink 112 includes silver nanoparticles which can be sintered to one another to form the electronic circuit 110. However, in some other examples, the ink 122 can include gold nanoparticles, copper nanoparticles, and the like. Any type of commercially available or otherwise conventional conductive ink can be used.

Figure 2:
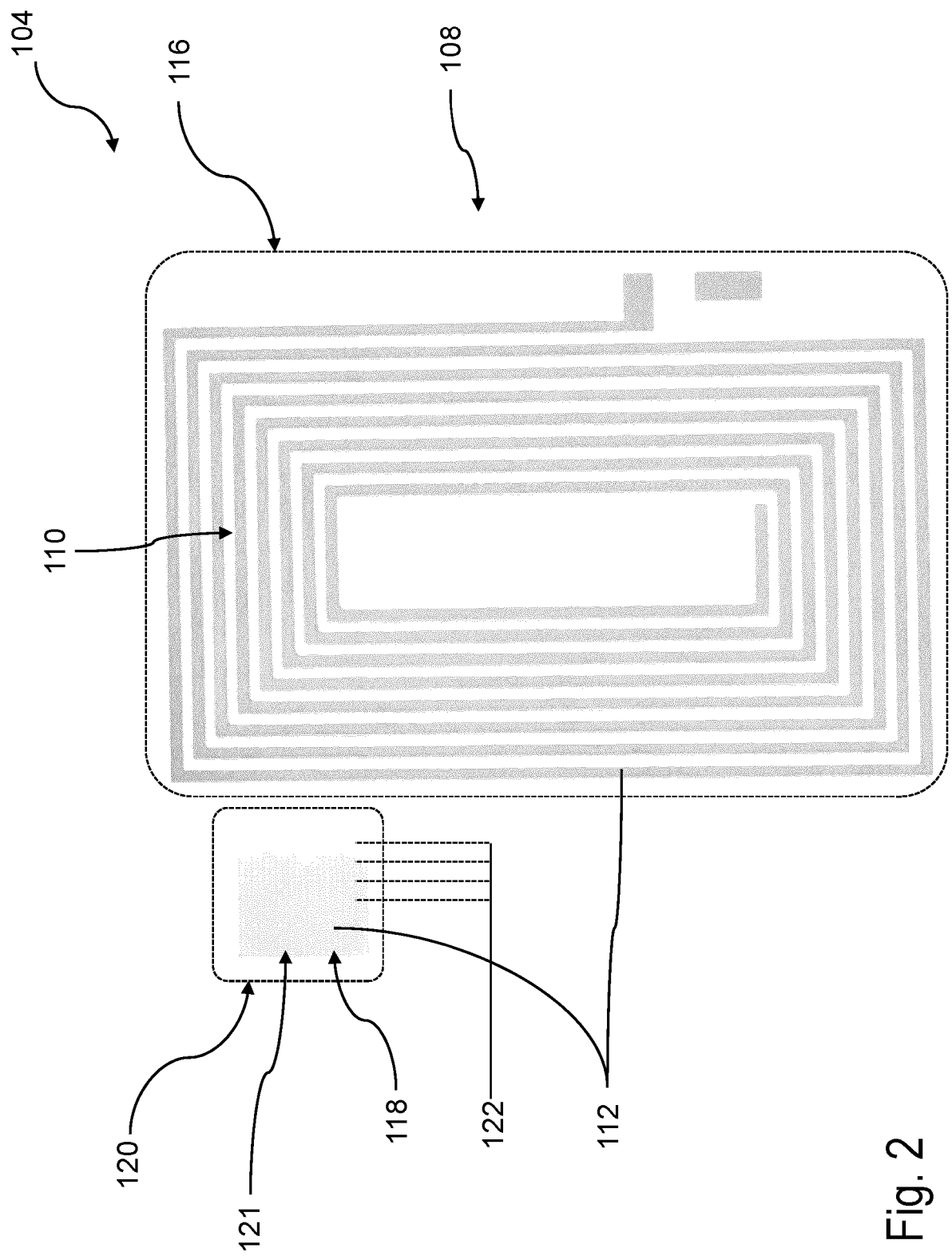
FIG. 2 is a top view of an example of an electronic device including a substrate on which an electronic circuit is printed and a metamaterial structure using the electronic device printing system of FIG. 1, in accordance with one or more embodiments.

Referring now to FIG. 2, the electronic device printing system 102 is configured to print the electronic circuit 110 on a given area 116 of the substrate 108 using the ink 112 and to also print a metamaterial structure 118 on a remaining area 120 of the substrate 108 using the same ink 112.

The metamaterial structure 118 is configured to interact at terahertz frequencies, usually defined as 0.1 to 10 THz, preferably between 100 GHz and 1 THz, and most preferably of about 230 GHz. Indeed, terahertz radiation lies at the far end of the infrared band, just after the end of the microwave band, and corresponds to millimeter and sub-millimeter wavelengths between 3 mm and 0.03 mm. The term "terahertz" is meant to be interpreted broadly so as to encompass frequencies lying near the commonly accepted boundaries of the terahertz region of the electromagnetic spectrum.

Figure 3B:
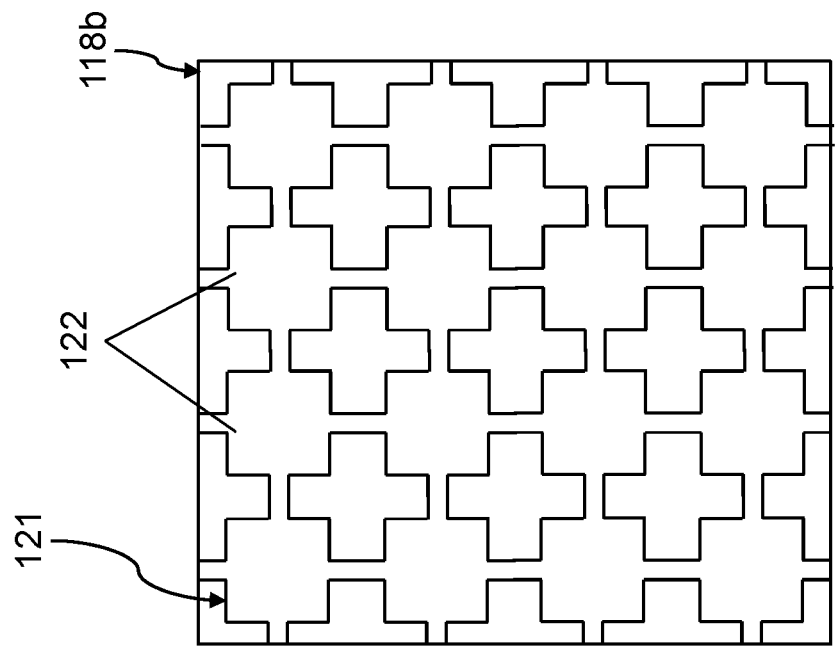
FIGS. 3A and 3B are top views of examples of metamaterial structures of the electronic device of FIG. 2, in accordance with some embodiments.
Figure 3A:
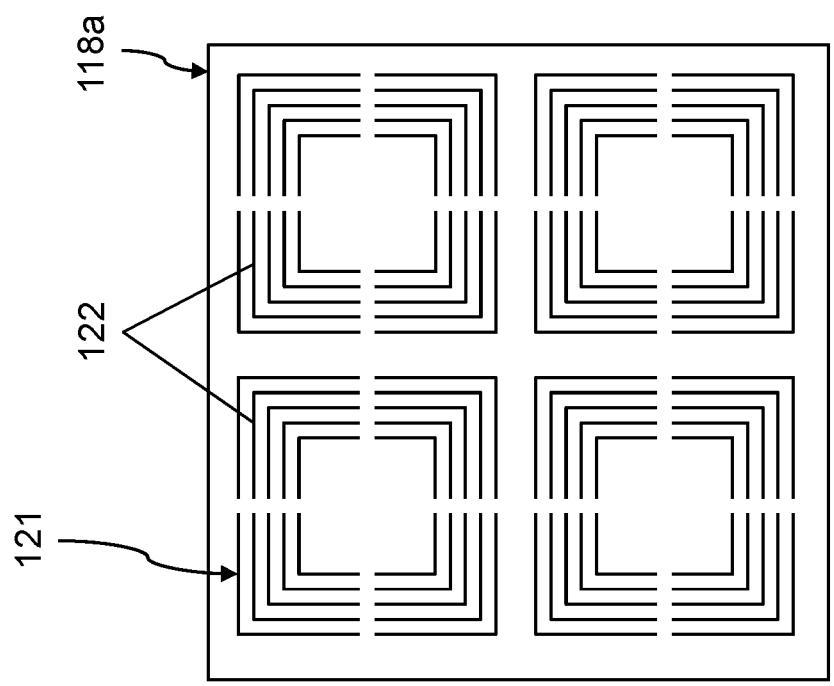

More specifically, the metamaterial structure 118 shown in this example has a pattern 121 of elements 122 which collectively provide a terahertz resonance frequency to the metamaterial structure 118. FIGS. 3A and 3B show other examples of metamaterial structures 118a and 118b in greater detail. As can be understood, any suitable metamaterial structure providing a terahertz resonance frequency can be used.

In these examples, the metamaterial structures 118a and 118b can have dimensions ranging between 1 mm and 50 mm, preferably between 5 mm and 30 mm, and most preferably between 10 mm and 25 mm. The elements 122 can have dimensions ranging between 0.02 mm and 1.00 mm, preferably between 0.1 and 0.8 mm, and most preferably between 0.5 and 0.7 mm.

Referring back to FIG. 1, the electronic device testing system 106 has one or more terahertz radiation emitters (hereinafter "the terahertz radiation emitters 124") which are each configured to emit an incident terahertz radiation beam 126 to be incident on the metamaterial structure 118 of the substrate 108 of the electronic device 104.

It is intended that the incident terahertz radiation beam 126 has power at least at least the terahertz resonance frequency of the metamaterial structure 118 so that a spectral power distribution of the incident terahertz radiation beam 126 can be modified depending on an actual conductivity of the ink 112 used to print the metamaterial structure 118.

Generally, the greater the conductivity value of the ink 112 is, the more the metamaterial structure 118 will absorb, scatter and/or diffract power at the terahertz resonance frequency. Conversely, the lower the conductivity value of the ink 112 is, the lesser the metamaterial structure 118 will absorb and/or diffract power at the terahertz resonance frequency.

The electronic device testing system 106 has one or more terahertz radiation receivers (hereinafter "the terahertz radiation receivers 128") which are each configured to receive an outgoing terahertz radiation beam 130 outgoing from the metamaterial structure 118 and to measure an amplitude of an electric field (sometimes referred to simply as "electric field amplitude") of the outgoing terahertz radiation beam 130 at least at the terahertz resonance frequency.

In some embodiments, the terahertz radiation receiver 128 is a terahertz time domain spectroscopy (THz-TSD) receiver which measures an amplitude of the electric field of the outgoing terahertz radiation beam 130 as function of time, and which is configured for performing a Fourier transform of that signal to provide amplitude as a function of frequency. However, the terahertz radiation receiver 128 can be any type of suitable terahertz radiation receiver such as a terahertz spectrometer or imager, for instance.

As illustrated, the substrate 108 in this example is disposed between the terahertz radiation emitters 124 and the terahertz radiation receivers 128. As such, the outgoing terahertz radiation beam 130 results from the propagation of the incident terahertz radiation beam 126 through the substrate 108 and is thus collinear with the incident terahertz radiation beam 126 in this example.

However, in some other embodiments, the terahertz radiation emitters 124 and the terahertz radiation receivers 128 can be disposed on a same side relative to the substrate 108, in which case the outgoing terahertz radiation beam 130 can result from reflection, scattering and/or diffraction of the incident terahertz radiation beam 130 on the substrate 108. In other words, in some embodiments, the outgoing terahertz radiation beam 130 can include the remaining part of the incident terahertz radiation beam that is not absorbed by the metamaterial structure 118. In some embodiments, the terahertz radiation beam can include terahertz radiation of the incident terahertz radiation beam that is scattered and/or otherwise diffracted by the metamaterial structure 118.

As depicted in this example, the electronic device testing system 106 has a controller 132 which is communicatively coupled to the electronic device printing system 102, to the terahertz radiation emitters 124 and to the terahertz radiation receivers 128.

The controller 132 is configured to determine a conductivity value being indicative of a conductivity of the ink 112 based on the amplitude of the electric field of the outgoing terahertz beam 130 at least at the terahertz resonance frequency.

In this example, the controller 132 is configured to generate a signal indicative of an action to be performed when the determined conductivity of the ink 112 is below a given conductivity threshold.

For instance, in some embodiments, the controller 132 is configured to generate an electronic file or alert indicating that one or more of the electronic devices 104 have been printed with ink having a conductivity value which is below the given conductivity threshold. Accordingly, the electronic devices logged in this file or alert can be later removed from the production line as they are most likely to be unsatisfactory.

In some other embodiments, the controller 132 is configured to modify at least one printing parameter of the electronic device printing system 102. For instance, the printing parameter can include, but is not limited to, a flow rate indicative at which flow rate the ink 112 is deposited on the substrate 108, a thickness of the conductive traces that are printed, a percentage of conductive material (e.g., silver nanoparticles) in the ink 112, a temperature of the sintering system, and other suitable printing parameters which can lead to increasing the conductivity of the ink 112 drawn from the ink reservoir 114.

In these embodiments, once one or more printing parameters have been modified, for electronic devices having been identified as unsatisfactory, the controller 132 can instruct the electronic device printing system 102 to reprint, wholly or partially, the electronic circuit of these electronic circuits so as to render them satisfactory. As can be understood, proceeding accordingly can reduce losses, and thus increase efficiency of the production line.

As can be understood, the electronic device testing system 106 can allow the quality of the printed electronic devices 104 to be controlled and optimized in real time or quasi real time based on the determined conductivity value during production of the electronic devices.

Figure 4:
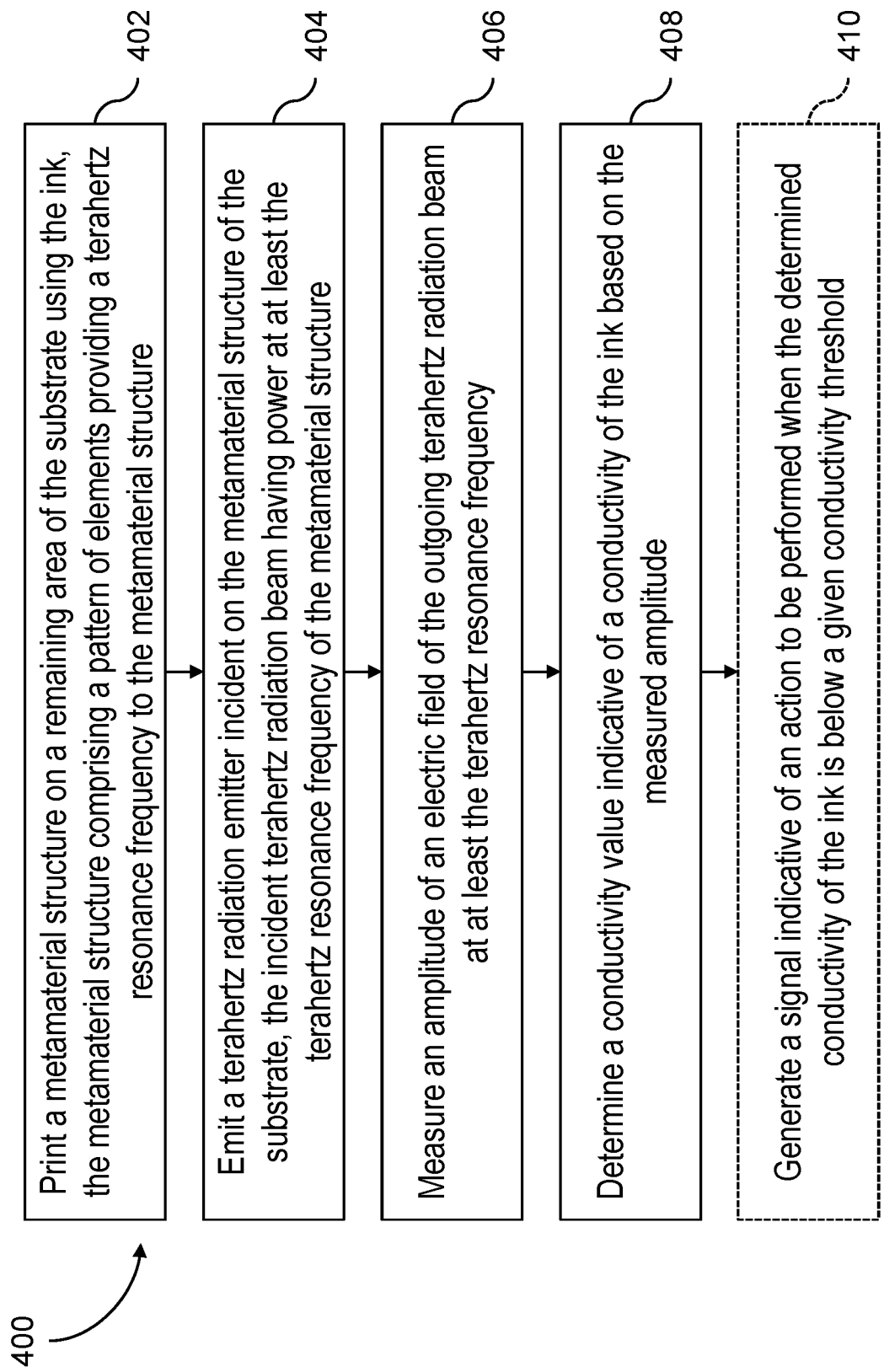
FIG. 4 is a flowchart of a method for testing the electronic device of FIG. 2, in accordance with one or more embodiments.

FIG. 4 shows a flowchart of an example of a method 400 for testing an electronic device 104 having the electronic circuit 110 being printed on the given area 116 of the substrate 108 using the ink 112. The method 400 will be described with reference to the electronic device production system 100 of FIG. 1 for ease of reading.

At step 402, the electronic device printing system 102 prints a metamaterial structure 118 on a remaining area 120 of the substrate 108 using the ink 112. As mentioned above, the metamaterial structure 118 has a pattern 121 of elements 122 providing a terahertz resonance frequency to the metamaterial structure 118. Accordingly, should the ink 112 be conductive to a satisfactory extent, the metamaterial structure 118 would absorb power of an incident terahertz radiation beam at least at the terahertz resonance frequency.

At step 404, each terahertz radiation emitter 124 emits a terahertz radiation beam 126 so as to be incident on the metamaterial structure 118 printed on the substrate 108. As discussed, the incident terahertz radiation beam 126 has power at least at the terahertz resonance frequency of the metamaterial structure 118, leaving an outgoing terahertz radiation beam 130 to be outgoing from the metamaterial structure 118.

At this stage of the method, the metamaterial structure 118 modifies a first spectral power distribution of the incident terahertz beam 126 which thereby causes the outgoing terahertz radiation beam 130 to have a second spectral power distribution being different from the first spectral power distribution should the ink 112 of the metamaterial structure 118 be conductive to a certain extent.

At step 406, each terahertz radiation receiver 128 measures an amplitude of an electric field of the outgoing terahertz radiation beam 130 at least at the terahertz resonance frequency.

At step 408, the controller 132 determines a conductivity value indicative of a conductivity of the ink 112 based on the measured amplitude of the electric field of the outgoing terahertz radiation beam 130.

At step 410, the controller 132 generates one or more signals indicative of one or more actions to be performed when the determined conductivity of the ink 112 of the metamaterial structure 118 is determined to be below a given conductivity threshold. Step 410 may be omitted in some embodiments.

The controller 132 can be provided as a combination of hardware and software components. The hardware components can be implemented in the form of a computing device 500, an example of which is described with reference to FIG. 5. Moreover, the software components of the controller 132 can be implemented in the form of a software application 600, an example of which is described with reference to FIG. 6.

Figure 5:
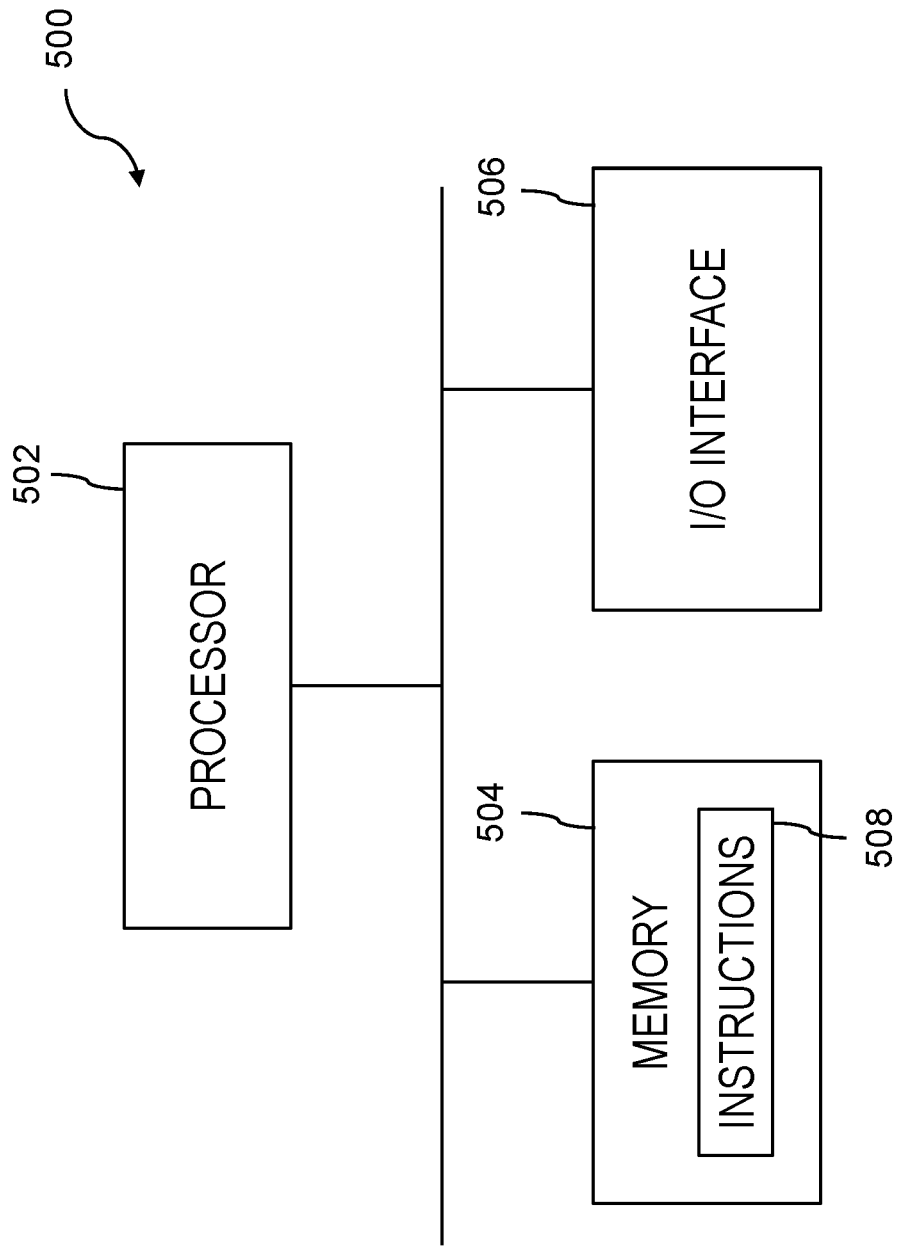
FIG. 5 is a schematic view of an exemplary computing device of the controller of FIG. 1, in accordance with one or more embodiments.

Referring to FIG. 5, the computing device 500 can have a processor 502, a memory 504, and I/O interface 506. Instructions 508 for performing the method 400, and/or any other related steps described herein, can be stored on the memory 504 and are accessible by the processor 502.

The processor 502 can be, for example, a general-purpose microprocessor or microcontroller, a digital signal processing (DSP) processor, an integrated circuit, a field programmable gate array (FPGA), a reconfigurable processor, a programmable read-only memory (PROM), or any combination thereof.

The memory 504 can include a suitable combination of any type of computer-readable memory that is located either internally or externally such as, for example, random-access memory (RAM), read-only memory (ROM), compact disc read-only memory (CDROM), electro-optical memory, magneto-optical memory, erasable programmable read-only memory (EPROM), and electrically-erasable programmable read-only memory (EEPROM), Ferroelectric RAM (FRAM) or the like.

Each I/O interface 506 enables the computing device 500 to interconnect with one or more input devices, such as the terahertz radiation receivers 128, or with one or more output devices such as the electronic device printing system 102, the terahertz radiation emitters 124, the sintering system and any other component of the production line if need be.

Each I/O interface 506 enables the controller 132 to communicate with other components, to exchange data with other components, to access and connect to network resources, to serve applications, and perform other computing applications by connecting to a network (or multiple networks) capable of carrying data including the Internet, Ethernet, plain old telephone service (POTS) line, public switch telephone network (PSTN), integrated services digital network (ISDN), digital subscriber line (DSL), coaxial cable, fiber optics, satellite, mobile, wireless (e.g. Wi-Fi, WiMAX), SS7 signaling network, fixed line, local area network, wide area network, and others, including any combination of these.

Figure 6:
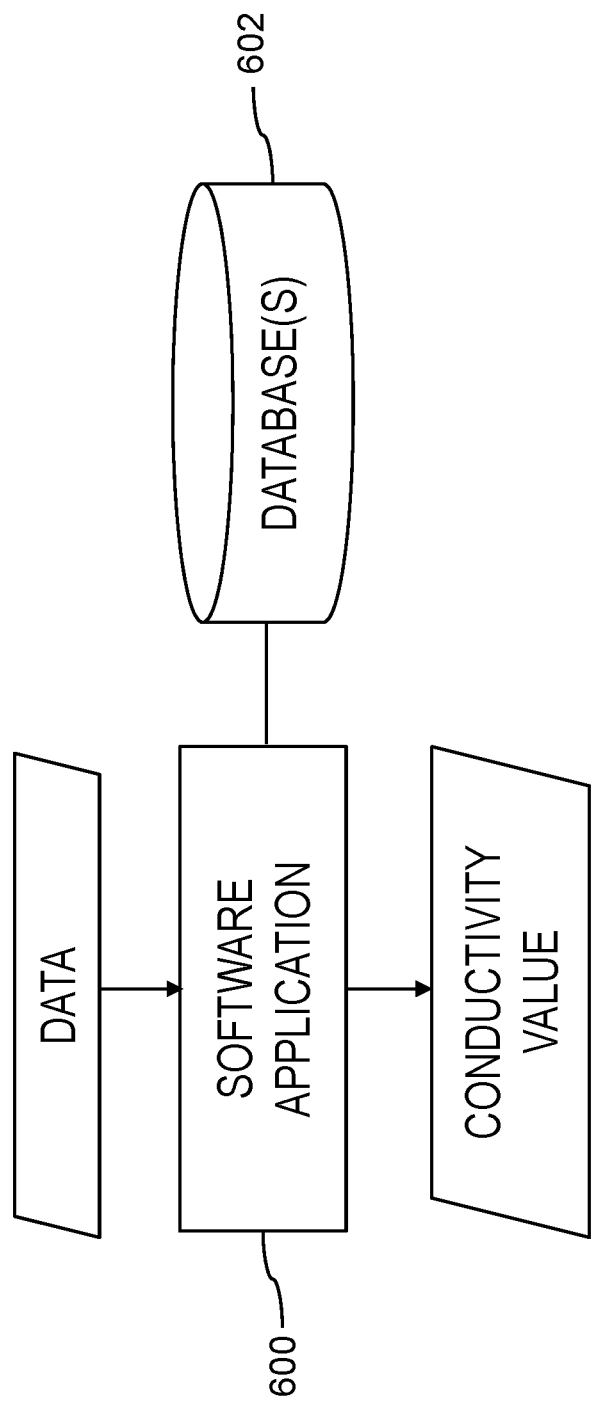
FIG. 6 is a schematic view of an example of a software application of the controller of FIG. 1 being configured to perform at least some steps of the method of FIG. 4, in accordance with one or more embodiments.

Referring now to FIG. 6, the software application 600 is configured to receive one or more amplitude signal, values and/or data and to determine a conductivity value upon processing the amplitude values. In some embodiments, the software application 600 is stored on the memory 504 and accessible by the processor 502 of the computing device 500.

In some embodiments, one or more conductivity threshold values $P_{th}$ can be stored in one or more databases 602 which are accessible by the software application 600. In some other embodiments, the action(s) and/or instruction(s) to be performed when the determined conductivity value is above one of the conductivity threshold values $P_{th}$ can also be stored on the databases 602.

The computing device 500 and the software application 600 described above are meant to be examples only. Other suitable embodiments of the controller 132 can also be provided, as it will be apparent to the skilled reader.

Figure 7:
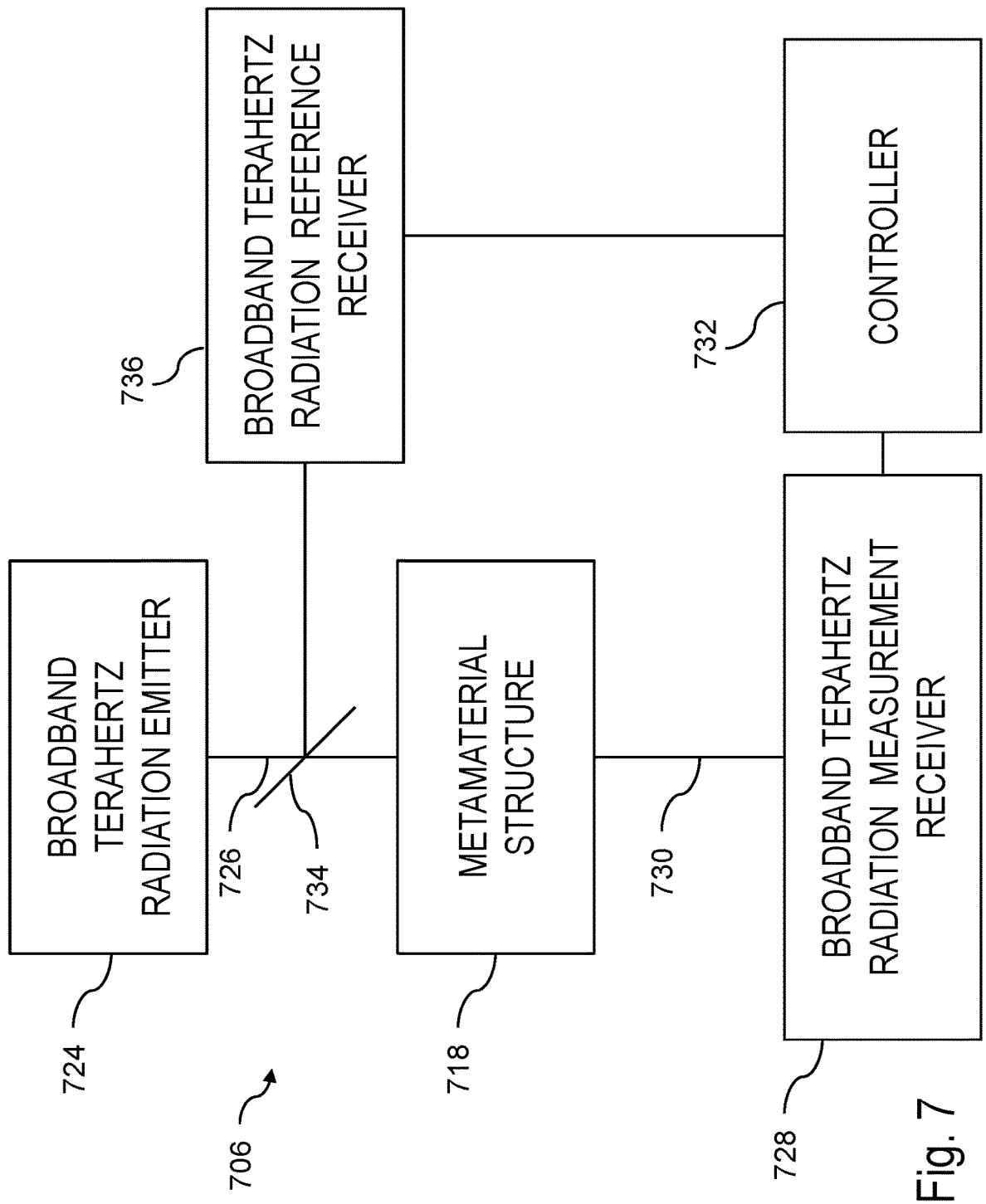
FIG. 7 is a schematic view of an example of an electronic device testing system, with broadband terahertz radiation reference and measurement receivers, in accordance with one or more embodiments.

FIG. 7 shows another example of an electronic device testing system 706, in accordance with another embodiment. As depicted, the electronic device testing system 706 has a broadband terahertz radiation emitter 724 which is configured to emit a broadband terahertz radiation beam 726 towards the metamaterial structure 718.

As can be understood, the terahertz radiation beam 726 is broadband as it has power at the terahertz resonance frequency of the metamaterial structure but also at other surrounding frequencies, spectrally-spaced from the terahertz resonance frequency. In other words, the broadband terahertz radiation beam 726 has power within a given range of frequencies including, the terahertz resonance frequency among other frequencies.

The electronic device testing system 706 has a terahertz radiation beam splitter 734 which is configured to redirect a portion of the incident terahertz radiation beam 726 towards a broadband terahertz radiation reference receiver 736 where a reference values can be measured.

The electronic device testing system 706 also has a broadband terahertz radiation measurement receiver 728 which is configured to receive a terahertz radiation beam 730 outgoing from the metamaterial structure 718.

In this example, the controller 732 receives data indicative of a spectral power distribution of the incident terahertz radiation beam 726 measured by the broadband terahertz radiation reference receiver 736 and a spectral power distribution of the outgoing terahertz radiation beam 730 as measured by the broadband terahertz radiation measurement receiver 728.

Figure 8A:
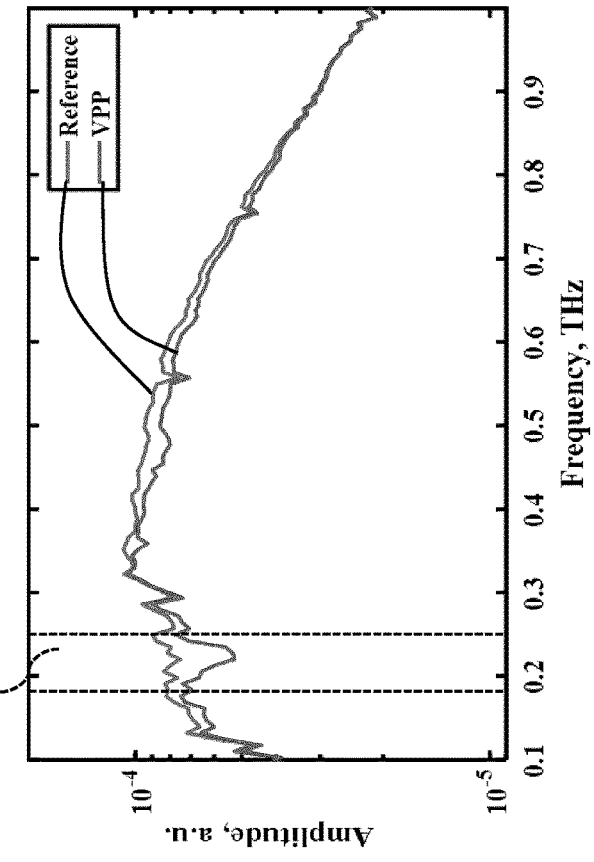
FIG. 8A is a graph showing reference and measurement electric field amplitudes as measured using the broadband terahertz radiation reference and measurement receivers of FIG. 7, respectively, in accordance with one or more embodiments.
Figure 8B:
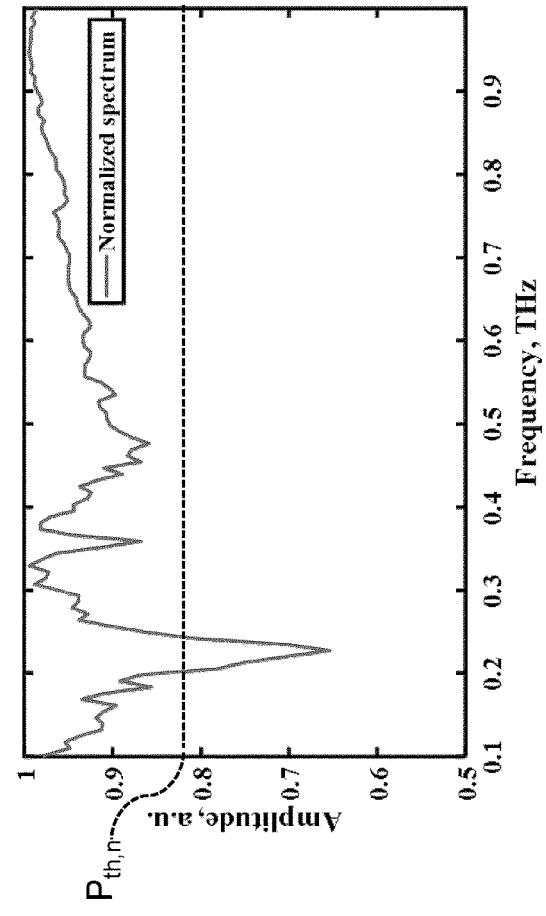
FIG. 8B is a graph showing the measurement electric field amplitude of FIG. 8A normalized using the reference electric field amplitude of FIG. 8A, in accordance with one or more embodiments.

Examples of such data are shown in FIG. 8A. As can be seen, in this example, the ink of the metamaterial structure 718 has a certain conductivity, as there is a difference in the amplitudes of the electric fields of the incident and outgoing terahertz radiation beams 726 and 730. This is emphasized in FIG. 8B, where a normalized spectral power distribution is shown. The normalized spectral power distribution can be obtained by dividing the spectral power distribution measured using the broadband terahertz radiation measurement receiver 728 by the spectral power distribution measured using the broadband terahertz radiation reference receiver 736. In this example, the conductivity value threshold $P_{th}$ can be provided in the form of a normalized spectral power threshold $P_{th,n}$ below which the conductivity value can be deemed to be satisfactory.

Figure 9:
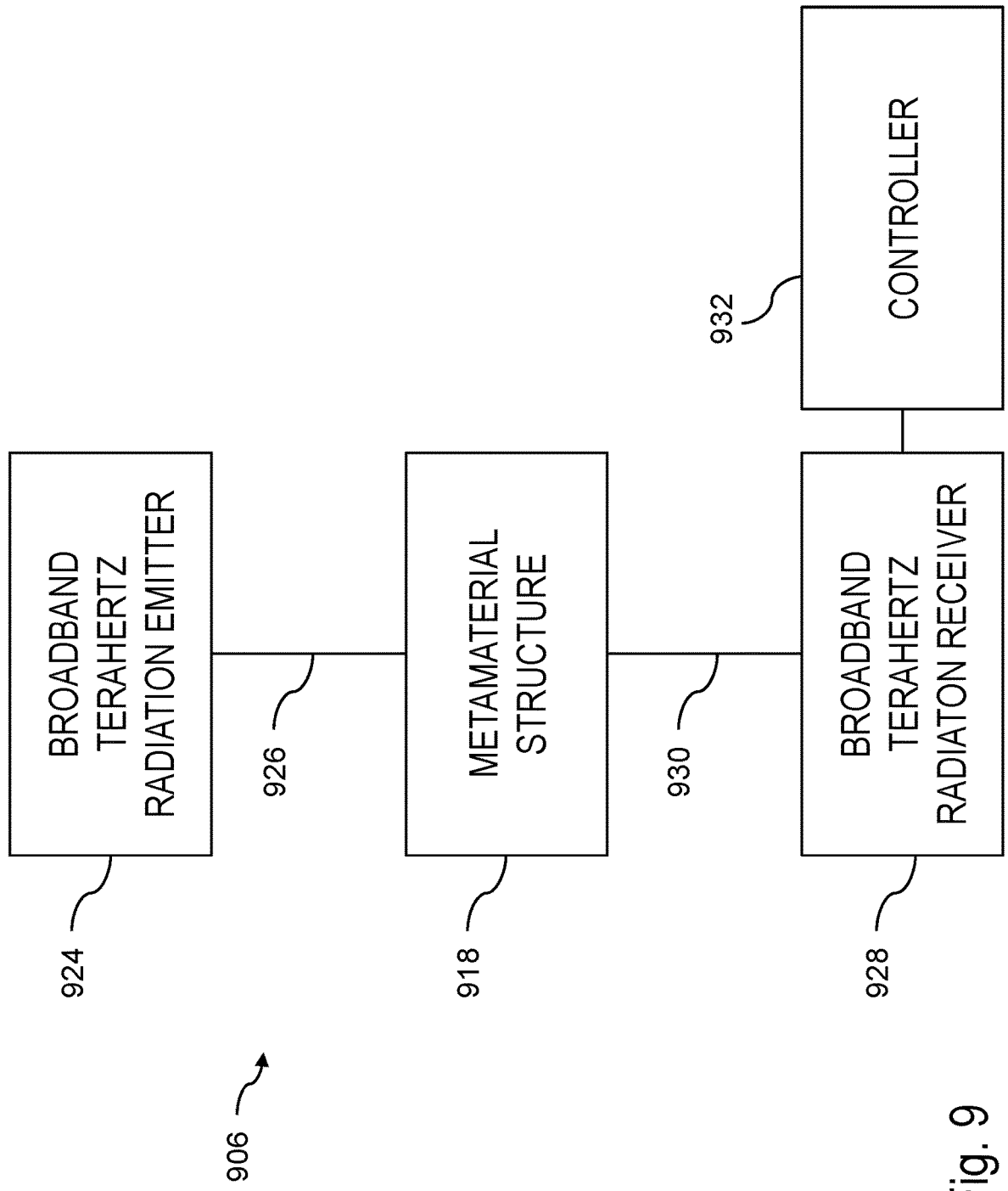
FIG. 9 is a schematic view of another example of an electronic device testing system, with a single broadband terahertz radiation receiver, in accordance with one or more embodiments.

FIG. 9 shows another example of an electronic device testing system 906, in accordance with another embodiment. As depicted, the electronic device testing system 906 has a single broadband terahertz radiation emitter 924 which is configured to emit a broadband terahertz radiation beam 926 towards the metamaterial structure 918.

Similarly, the terahertz radiation beam 926 is broadband as it has power at the terahertz resonance frequency of the metamaterial structure and also at other frequencies, spectrally-spaced from the terahertz resonance frequency.

In this example, the electronic device testing system 906 also has a single broadband terahertz radiation receiver 928 which is configured to receive a terahertz radiation beam 930 outgoing from the metamaterial structure 918.

In this example, the controller 932 receives data indicative of a spectral power distribution of the outgoing terahertz radiation beam 930 as measured by the broadband terahertz radiation receiver 928.

Figure 10:
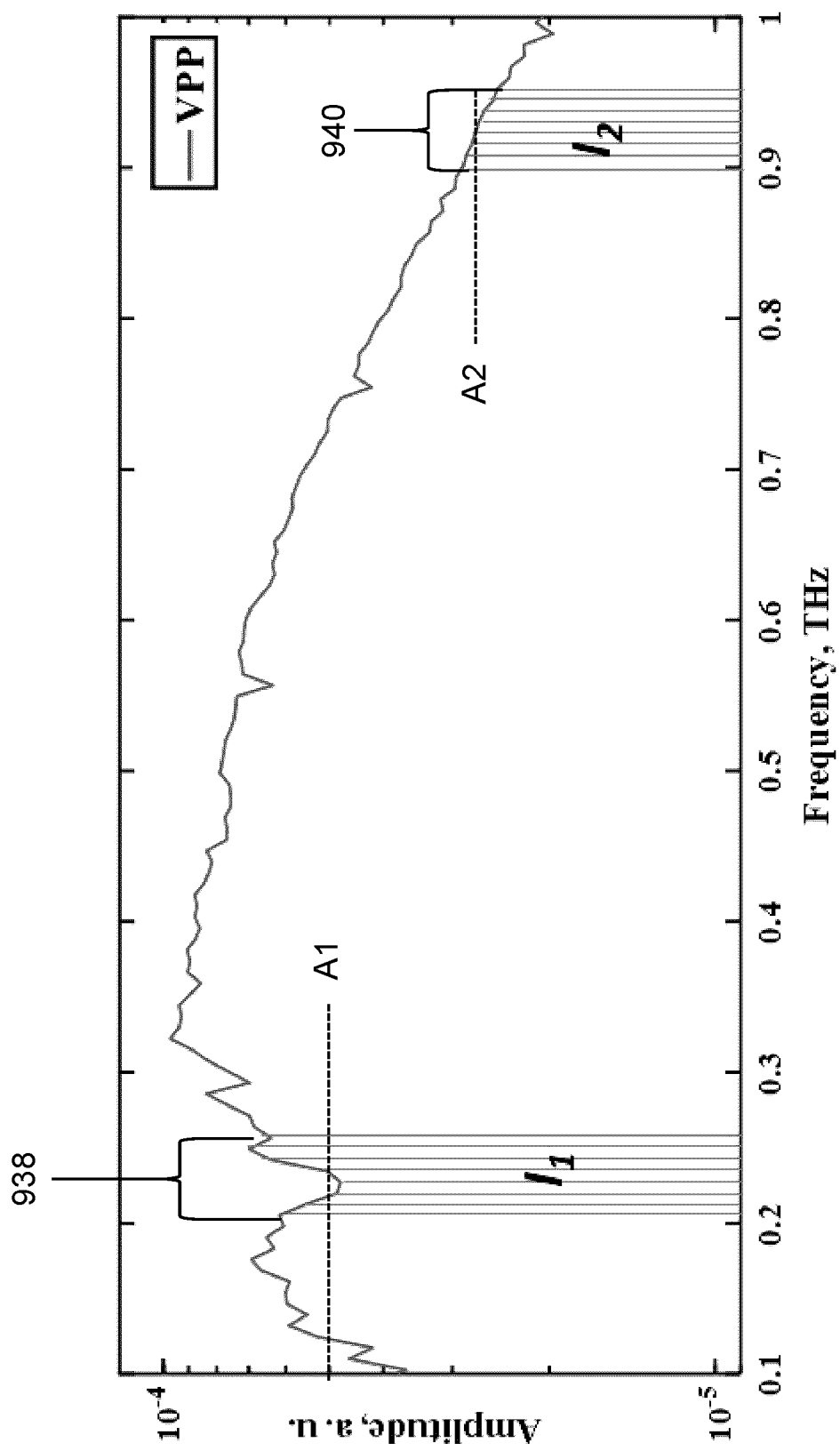
FIG. 10 is a graph showing the electric field amplitude as measured by the broadband terahertz radiation receiver of FIG. 9.

Examples of such data are shown in FIG. 10. As can be seen, in this example, the ink of the metamaterial structure 918 has a certain conductivity, as there is a difference between a first amplitude A1 of the electric field of the incident broadband terahertz radiation beam 926 in a first spectral region 938 including the terahertz resonance frequency and a second amplitude A2 of the electric field of the incident broadband terahertz radiation beam 926 in a second spectral region 940 spaced from the first spectral region 938.

In this embodiment, the controller 932 can be configured to determine a ratio of the first amplitude A1 and the second amplitude A2, which can be mapped to conductivity values based on some calibration data.

Figure 11:
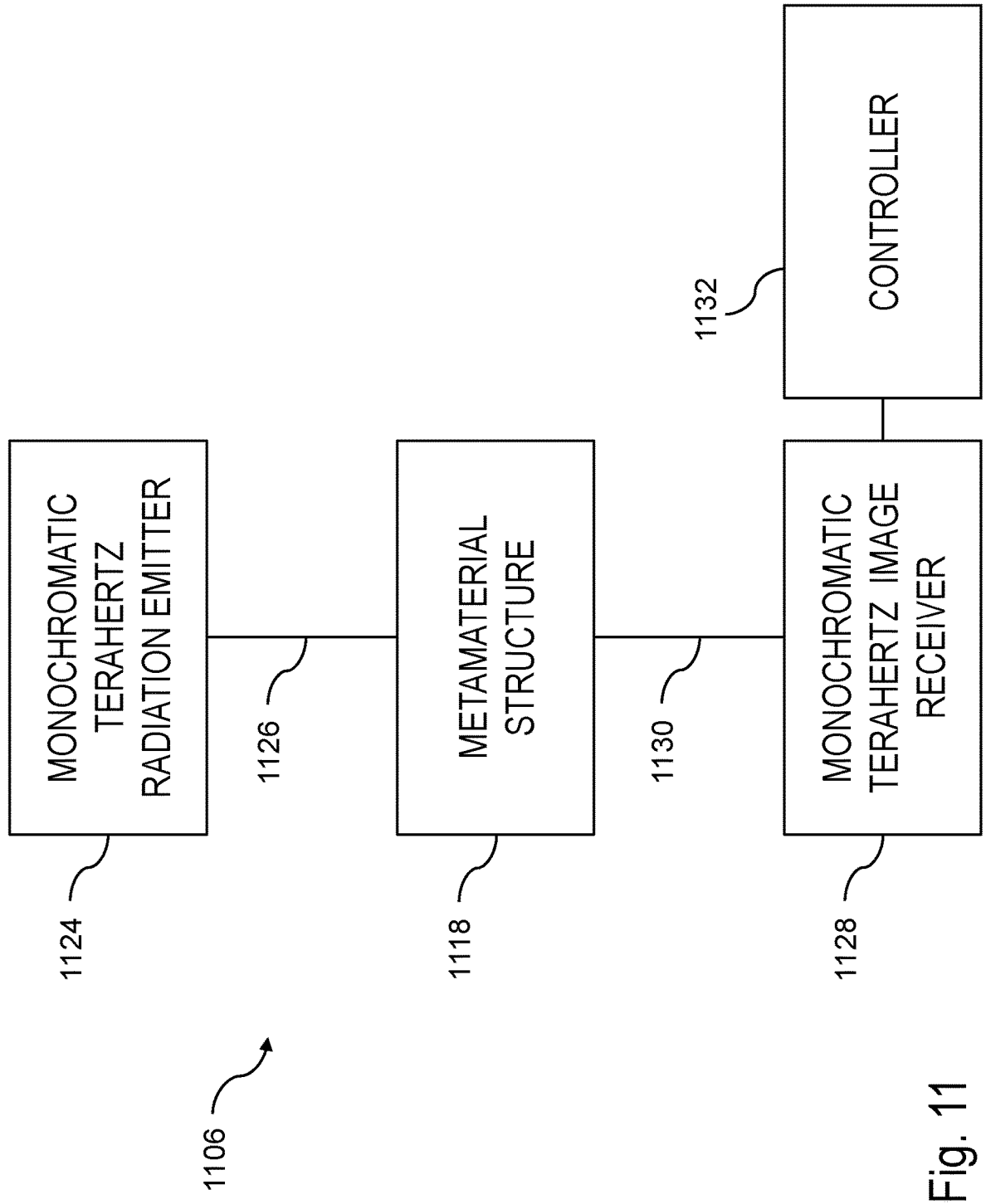
FIG. 11 is a schematic view of another example of an electronic device testing system, with a metamaterial structure provided in the form of a vortex phase plate, and a monochromatic broadband terahertz radiation image receiver, in accordance with one or more embodiments.

FIG. 11 shows another example of an electronic device testing system 1106, in accordance with another embodiment. As depicted, the electronic device testing system 1106 has a single monochromatic terahertz radiation emitter 1124 which is configured to emit a monochromatic terahertz radiation beam 1126 towards the metamaterial structure 1118.

The monochromatic terahertz radiation beam 1126 is said to be monochromatic as it can have power at the terahertz resonance frequency of the metamaterial structure. As can be understood, in this case, the terahertz frequency of the monochromatic terahertz radiation beam 1126 must be set to the terahertz resonance frequency of the metamaterial structure. It can have power at other frequencies, however it is not necessary in this example.

In this example, the metamaterial structure 1118 is provided in the form of a vortex phase plate 1142. As best seen in FIG. 12, and with reference to FIG. 13A, the vortex phase plate 1142 is configured to modify a first spatial distribution 1144 of the incident monochromatic terahertz radiation beam 1126 into a second, different spatial distribution 1146 of the outgoing terahertz radiation beam 1130. In this specific example, the first spatial distribution 1144 is a Gaussian spatial intensity distribution. Hence, the vortex phase plate 1142 modifies the Gaussian spatial distribution into a vortex spatial intensity distribution, which has less power in a center thereof. As can be understood, in such situations, the outgoing terahertz radiation beam 1130 has a doughnut shape, a corkscrew-shaped wavefront and/or an orbital angular momentum. However, it will be understood that the spatial distribution of the incident terahertz radiation beam can vary from one embodiment to another. For instance, the first spatial distribution 1144 can be a top hat power distribution in some embodiments.

Referring back to FIG. 11, the electronic device testing system 1106 also has a single monochromatic terahertz image receiver 1128 which is configured to receive a terahertz radiation beam 1130 outgoing from the metamaterial structure 1118 and to provide an image of the outgoing terahertz radiation beam 1130.

In this example, the controller 1132 receives data indicative of the image of the outgoing terahertz radiation beam 1130 as measured by the monochromatic terahertz image receiver 1128.

As can be understood, in this example, when the ink is not satisfactorily conductive, the first spatial distribution 1144 of the incident monochromatic terahertz radiation beam 1126 remains unchanged or almost unchanged, as shown in the image of FIG. 13B. However, when the ink is satisfactorily conductive, the second spatial distribution 1146 of the incident monochromatic terahertz radiation beam 1126 can change into the second spatial distribution, lacking power in a center region 1150 of the outgoing terahertz radiation beam 1130 compared to power in a region 1152 surrounding the center region 1150, such as shown in the image of FIG. 13C.

In some embodiments, the conductivity value can depend on a ratio between a first integrated amplitude bounded in the center region 1150 of the image and a second integrated amplitude of a region including the center 1150 and the surrounding region 1152.

Figure 14B:
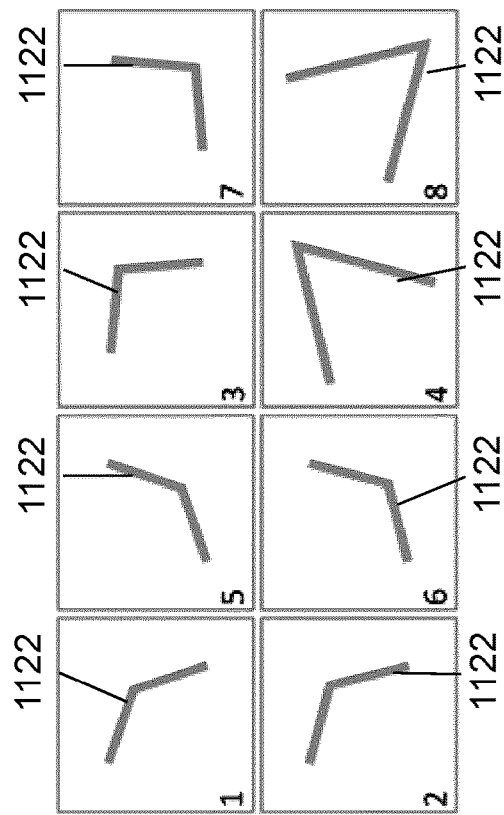
FIGS. 14B and 14C are top views of examples of the elbow-shaped elements of FIG. 14A, in accordance with one or more embodiments.
Figure 14C:
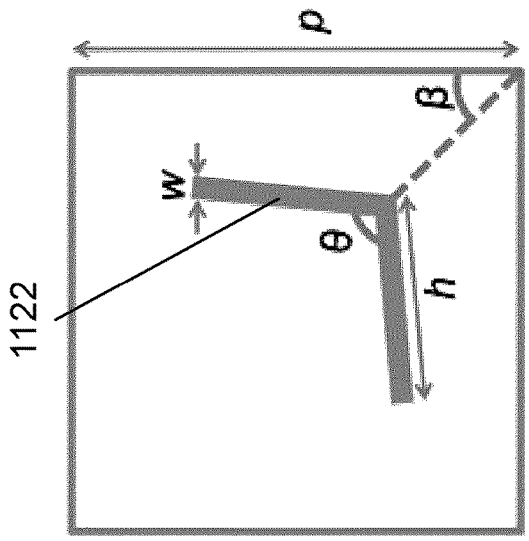
Figure 14A:
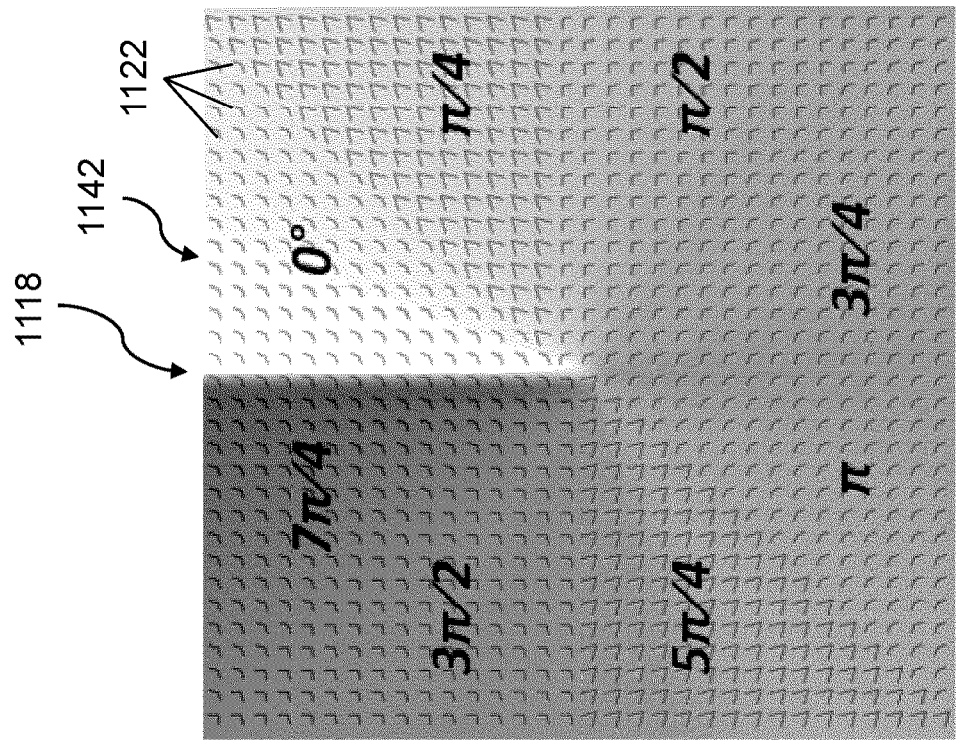
FIG. 14A is a top view of an example of the vortex phase plate of FIG. 12, showing a plurality of subsets of elbow-shaped elements, in accordance with one or more embodiments.

FIG. 14A shows an example of the vortex phase plate 1142, in accordance with one or more embodiments. As shown, the vortex phase plate 1142 includes a plurality of subsets of V-shaped or elbow-shaped elements 1122 where the elbow-shaped elements 1122 associated to each subset have a corresponding elbow angle θ, such as shown in FIGS. 14B and 14C.

Figure 15B:
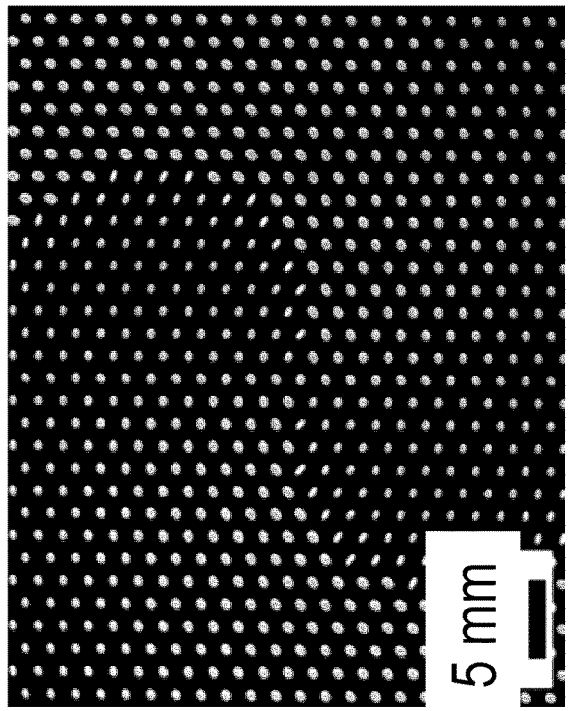
FIGS. 15A-D are top views of examples of vortex phase plates, in accordance with some embodiments.
Figure 15A:
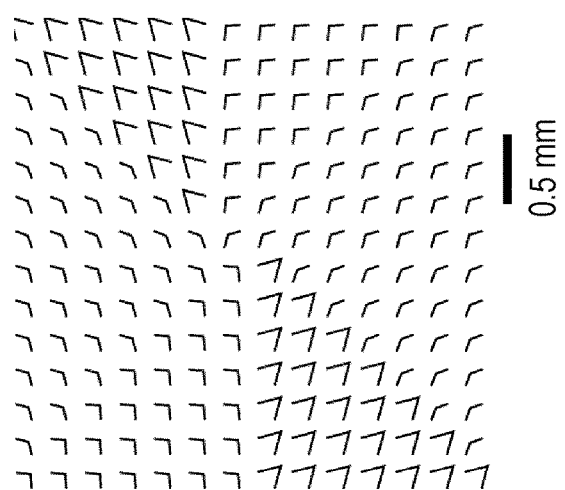
Figure 15D:
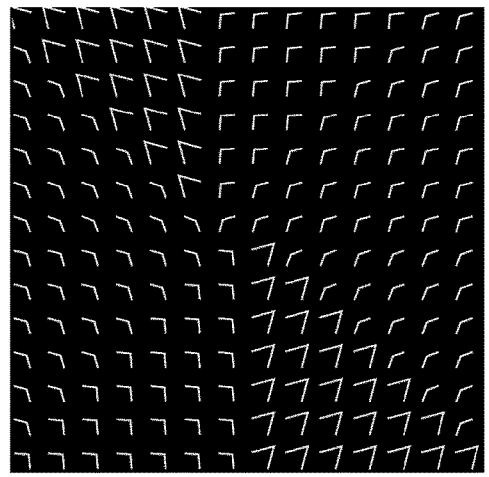
Figure 15C:
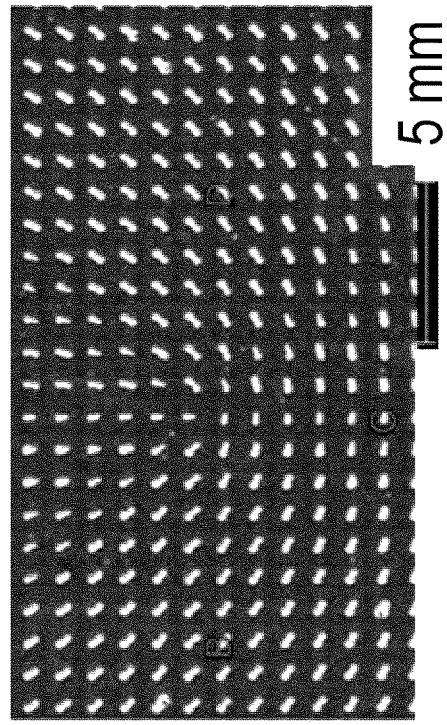

FIGS. 15A-D show examples of such vortex phase plates, in accordance with some other embodiments. In the examples of FIGS. 15A, 15B and 15C, the elements are positively printed on the substrate. However, in some other embodiments, such as in the example of FIG. 15D, the elements are negatively printed, i.e., a stencil is printed using the ink where the stencil has a plurality of spaced-apart apertures left untouched therein. It is noted that the vortex phase plate shown in FIG. 15B is inspired from A. Arbabi, et al. Nature Nanotechnology volume 10, pages 937-943 (2015) whereas the vortex phase plate shown in FIG. 15C is inspired from H.-T. Chen, A. J. Taylor, and N. Yu, A review of metasurfaces: physics and applications, Rep. Prog. Phys. 79, 076401 (2016).

Figure 16:
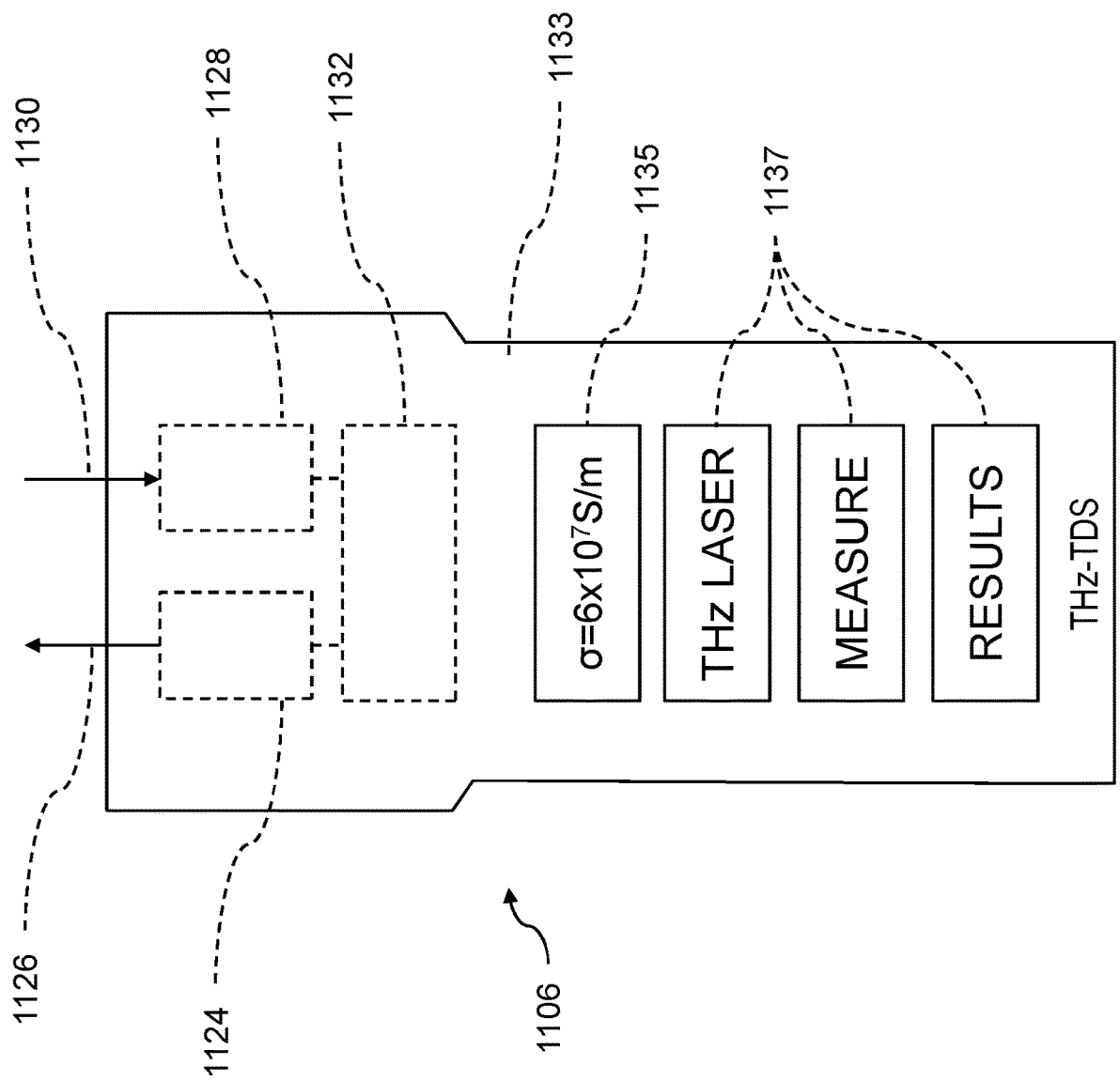
FIG. 16 is a schematic view of an example of the electronic device testing system of FIG. 11, shown in a portable format, in accordance with one or more embodiments.

As can be understood, the electronic device testing system 1106 can be enclosed within a portable frame 1133, such as the one shown in FIG. 16. Indeed, in this embodiment, the monochromatic terahertz radiation emitter and image receiver 1124 and 1128 are provided in the form of complementary metal-oxide-semiconductor (CMOS) devices which can have a reduced footprint compared to broadband terahertz radiation emitters and receivers. The electronic device testing system 1106 also has a display 1135 which can display any conductivity values by the controller 1132. Buttons 1137 can be provided also to initiate measurements and/or display measurement results on the display 1135. Example of such CMOS devices can be described in the following references: R. A. Hadi, et al., IEEE Journal of Solid-State Circuits 47, 2999 (2012); X. Wu et al., IEEE J. of Solid-State Circuits 51, 3049 (2016); M. M. Assefzadeh and A. Babakhani, IEEE J. Solid State Circuits 52, 2905 (2017); X. Wu and K. Sengupta, IEEE J. Solid State Circuits 52, 389 (2017); K. Sengupta and A. Hajimiri, IEEE J. Solid State Circuits 47, 3013 (2012); and J. Grzyb, B. Heinemann, and U. R. Pfeiffer, IEEE Trans. Microwave Theory Tech. 65, 4357 (2017).

Example 1—Contactless In Situ Electrical Characterization Method of Printed Electronic Devices with Terahertz Spectroscopy Printed electronic devices are attracting significant interest due to their versatility and low cost; however, quality control during manufacturing can be a significant challenge, at it may prevent the widespread adoption of such promising technology. In this example, it is shown that terahertz (THz) radiation can be used for the in situ inspection of printed electronic devices, as confirmed through a comparison with conventional electrical conductivity methods. This in situ method consists of printing a simple test pattern exhibiting a distinct signature in the THz range, i.e., a metamaterial such as described above, that enables the precise characterization of the static electrical conductivities of the printed ink. It is demonstrated that contactless dual-wavelength THz spectroscopy analysis, which can require only a single THz measurement, can be more precise and repeatable than conventional four-point probe conductivity measurements. The following results can open the door to a simple strategy for performing contactless quality control in real time of printed electronic devices at any stage of its production line.

Indeed, printable electronics (PE) manufacturing technology can be interesting to a large range of industries, from consumer goods, electronics, aerospace, automotive, pharmaceutical, biomedical, to textiles and fashion. It can offer an attractive alternative to conventional circuit manufacturing by enabling lower-cost, maskless, and rapid production of customized electronic devices. PE is compatible with a wide range of substrates, as long as they are not porous and can resist all fabrication steps, including pre- and post-printing processes. In addition, various kinds of conductive, semi-conductive, and dielectric inks are now commercially available. Therefore, PE allows the realization of unique electronic components that can be bent, twisted and stretched, all while retaining their electrical properties. In recent years, the development of various contact- and non-contact printing technologies, such as flexography, gravure, screen- or inkjet-printing, has advanced significantly. Post-printing processes also play a key role in the manufacturing of PE devices. The most commonly used sintering approaches are conventional thermal annealing, electrical sintering, microwave, and photonic sintering by either continuous-wave laser irradiation or high-power flashing lamps. While the spatial resolution and definition of the device are related to the printing method, the quality of the electrical properties of the printed devices is directly related to the post-printing process. Particularly, the solid and uniform dielectric or metallic tracks from the printed pattern are obtained during this step.

The quality of PE devices can be evaluated using different types of microscopy, such as atomic force microscopy, scanning electron microscopy or optical microscopy, which are well-established tools for analyzing the surface morphology of materials. Nevertheless, these techniques can be expensive, slow, and allow limited surface area observation. Other types of characterization techniques, such as crystallography analysis, thermography, elecro- or photo-luminescence, may also be time-consuming and can require special conditions, such as vacuum or helium environments, to avoid noise and damage. The electrical conductivity of printed traces in flexible PE circuits can be assessed using conventional methods drawn from the electronics industry, e.g., the flying probes or four-point probe method (4PP). However, these techniques cannot be envisioned for high-volume roll-to-roll (R2R) printing since in-line contact methods are not compatible with continuous manufacturing tools. Thus, the non-contact conductivity characterization method described herein can be practical in at least some situations.

Traditional graphic art printing or off-set printing used in the manufacture of full-color magazines, posters, packaging, etc., evaluates print quality using a color control bar (GATF Standard Offset Color Bar). Using a densitometer or a spectrophotometer, these bars allow for accurate determination of ink density, dot gain, and screen angle accuracy. Generally, the color control bars are printed away from the immediate image area, and are often cut off or hidden during final assembly. Similarly, for PE production, an in situ quality control characterization technique has to be developed. Time-domain spectroscopy (TDS), using electromagnetic terahertz (THz) radiation, i.e., for frequencies ranging from about 100 GHz to about 10 THz, is a powerful tool that allows non-destructive characterization, and which is very sensitive to the conductivity of matter. THz waves have previously been used to characterize carbon printed ink with the THz imaging method. However, for high volume production, such approach is time consuming and may require complicated data analysis to efficiently recover the conductive property of the printed devices. Alternatively, THz engineered structures, such as metamaterials, can exhibit a strong response in transmission- or reflection-type geometries with a high dependency on material conductivity. Therefore, it can provide a straightforward sensing tool to retrieve the conductive property of the printed ink. Already, THz metamaterials printed by inkjet, digital aerosol jet, laser printing or electro-hydrodynamic jet printing have been reported, allowing for rapid fabrication of THz metamaterial-based sensors and functional THz devices using PE methods.

Figure 17:
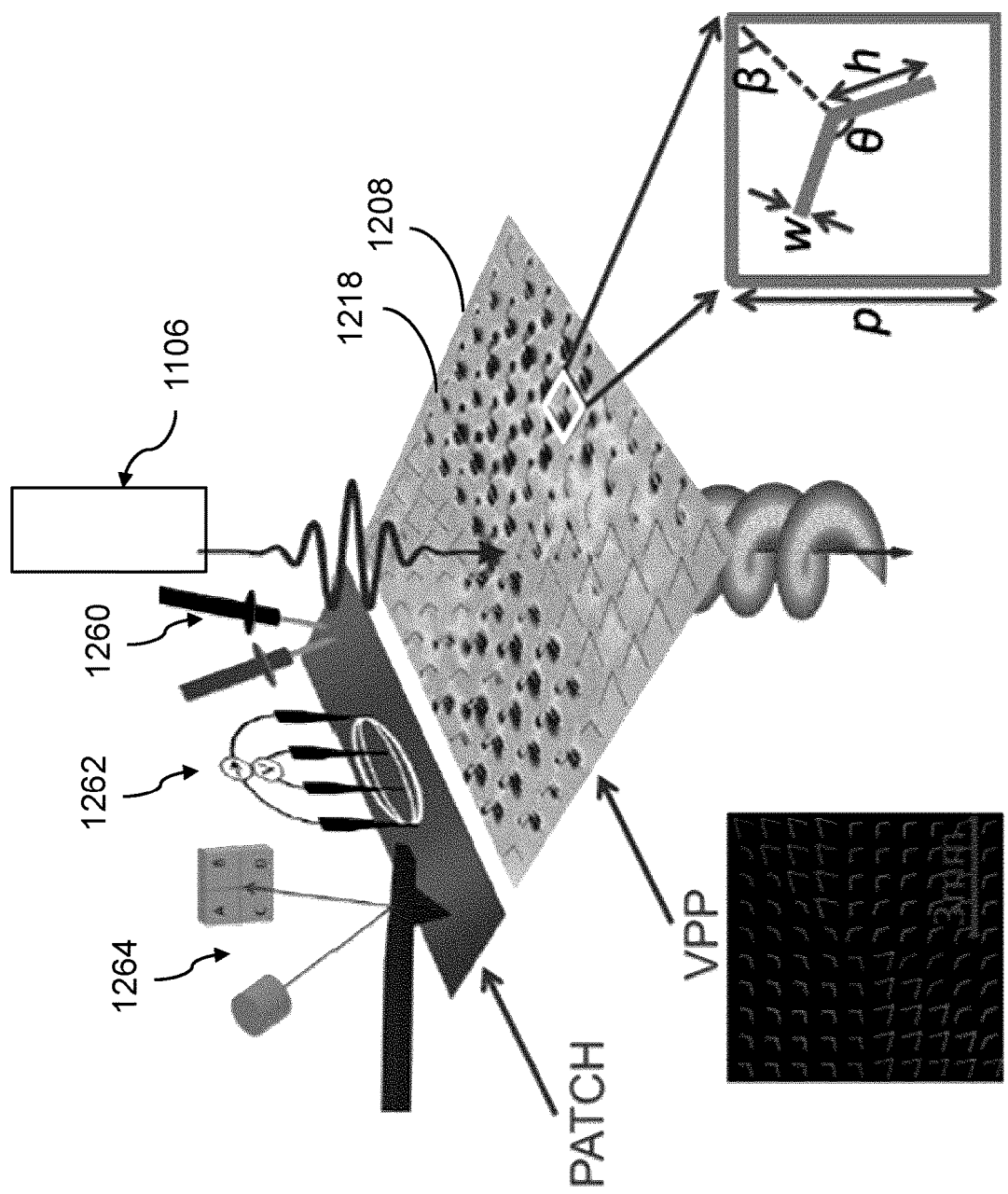
FIG. 17 is an oblique view of an example setup to compare the conductivity measurements using of an example of the THz-TDS of FIG. 16 and other measurement setups including an atomic force microscopy (AFM) measurement setup, a four-point probe (4PP) measurement setup, and a multimeter measurement setup, in accordance with one or more embodiments.

In this example, a THz engineered resonance structure (also referred to as "metamaterial structure" in this disclosure) has been developed as a quality control bar to probe the post-printing manufacturing process of PE devices. Some objectives were to determine the transmission resonant behavior of a control bar using THz waves as a function of ink conductivity and to link the THz frequency conductivity with the static conductivity of printed devices that are manufactured simultaneously (i.e., with the same sintering condition). As illustrated in FIG. 17, a comparative study was performed between THz inspection of a resonant metamaterial structure 1218 printed on a substrate 1208 using the electronic device testing system 1106 and conventional conductivity measurement methods, i.e., using a multimeter (MM) measurement setup 1260, a four-point probe (4PP) measurement setup 1262 and an atomic force microscopy (AFM) measurement setup 1264. The THz measurements performed using the electronic device testing system 1106 are well-correlated with the non-resonant printed structure conductivities and confirm the ability to determine the quality of the post-printing manufacturing process of PE devices by THz inspection of a simple control bar showing a distinctive response in the THz frequency range. To retrieve the resonance response of the control bar, standard terahertz time-domain spectroscopy (THz-TDS) was utilized. In addition, the well-known THz transmission method was compared through a novel dual-wavelength THz spectroscopy (DWTS) analysis. It is showed herein that DWTS determines the conductivity of the PE device using a single scan measurement. Additionally, the proposed method may not rely on THz phase-sensitive measurements, and is therefore ideally suited for next-generation low-cost THz emitters and sensors and opens the door to contactless in situ quality control of PE devices.

A special printed pattern sample was designed consisting of two parts: (i) a resonant structure at THz frequency, and (ii) a rectangular "patch" sample. These two patterns will serve as comparative tools between THz spectroscopy and conventional methods described herein, respectively. As shown in FIG. 17, the resonant "control bar" consists of a THz vortex phase plate (VPP) made of V-shape antennas, whereas the "patch" consists of a 1×10 mm² printed rectangular shape.

The unit cell design of the VPP antenna yields a specific resonant response to electromagnetic waves, and as commonly known for metamaterial structures, these properties are preserved in a macroscopic medium fabricated from their individual units. Similarly, as for electrically tunable metamaterials, here the variability in resonance response was probed as a function of ink conductivity. As expected for metamaterials, a printed VPP sample with lower conductivity will cause the resonance to be damped.

The VPP with topological number I=1 was designed according to the work of Jignwen He et al. It is made of eight sectors in this example, which supply a phase changing from 0 to $2\pi$ with a step size of $\pi/4$. Each sector was formed from one type of V-shaped antenna, as depicted in the right inset of FIG. 17, and made from two rectangular slits attached at one end at a specific angle ($\theta$), in which geometrical parameters include dimensions of p=600 μm, w=30 μm, $\beta$=45 for all antennas. The length of the slit h=234, 246, 270, 450 μm and the angle between slits $\theta$=130°, 120°, 100°, 60° according to order of antennas in the literature. Similarly, all geometrical aspect values of angles $\theta$ and $\beta$ were kept, whereas $\beta$ was the angle between the bisector line of a V-shaped antenna and the x-axis. Due to the resolution of the printer, and according to the frequency spectrum of the terahertz radiation source, the dimensions of the unit cell (p) and the length of the slit (h) were increased three-fold. A feature width (w) of 30 μm was set and chosen according to the minimum dimension of printed silver ink traces, only limited by the printer spatial resolution. The right inset of FIG. 17 illustrates one of the eight types of antennas with the notation of geometrical parameters. The full sample area consisted of 30×30 V-shaped antennas, with its central frequency expected to be around 0.25 THz.

All samples were printed using a Ceradrop F-Serie Inkjet Printer (Limoges, France) with 1 pl Dimatix cartridge (FUJIFILM Dimatix, Santa Clara, Calif., USA) that dispensed drops with a droplet spacing (center-to-center distance between ejected drops) of 20 μm. Only one nozzle was used to perform the printing. The jetting frequency was set at 500 Hz. A commercially available conductive silver ink DGP 40TE-20C (ANP, Pleasanton, Calif., USA) was used that contains silver nanoparticles (Ag NPs) of sizes around 50 nm with 30-35 wt. % in triethylene glycol monomethyl ether solvent. The substrate used for printing was a heat-stabilized polyethylene terephthalate (PET) polyester film (Melinex ST505, New Berlin, Wis., USA). The chuck was maintained at a constant temperature of 60° C. during the printing process. An in situ Adphos Near Infrared (NIR) Dryer Module CER-42-250 (Bruckmühl, Germany) was used to perform the annealing step of the printed patterns. The displacement time of the lamp was varied from 0.03 s/mm to 0.2 s/mm in order to obtain a set of samples with different thermal histories, resulting in a range of conductivities. A confocal laser microscope (Olympus LEXT OLS4000, Center Valley, Pa., USA) was used to determine the thickness of the printed structure, which was found to be around 400 nm. The left inset of FIG. 17 shows a visible image of the center part of a printed vortex phase plate. The precise definition of the V-shaped antennas observed in the left inset of FIG. 17 confirms the ability of the inkjet printer to achieve the proper design.

Assessments of the VPP control pattern were performed using (THz Time-Domain Spectroscopy) THz-TDS measurements. An ultrafast Ti:Sapphire oscillator laser with a center wavelength of 805 nm producing pulses with a duration of ~20 fs and a repetition rate of 80 MHz was used in combination with two LT-GaAs photoconductive antennas from Teravil (Vilnius, Lithuania). A beam splitter 80:20 splits the laser beam into an optical pump and a probe beam for THz generation and detection, respectively. The emitter and the detector were placed in front of each other, separated by a distance of around 40 cm. An optical chopper at 330 Hz was placed just after the emitter, allowing for lock-in detection. The samples were placed between the emitter and detector at normal incidence for transmission spectroscopy in air at room temperature and pressure.

Figure 18B:
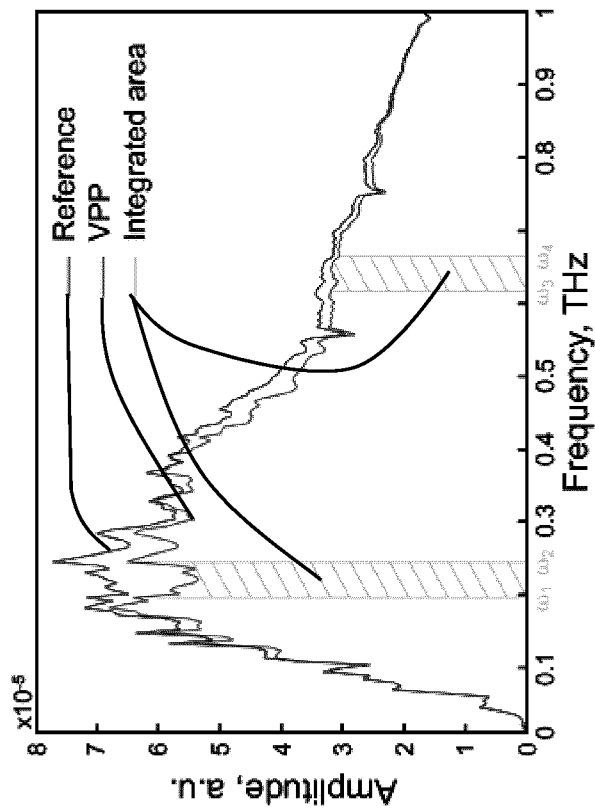
FIG. 18B is a graph showing transmitted amplitude THz spectra of the vortex phase plate of FIG. 17, showing spectral regions probed by a dual-wavelength THz spectroscopy (DWTS) receiver, in accordance with one or more embodiments.
Figure 18A:
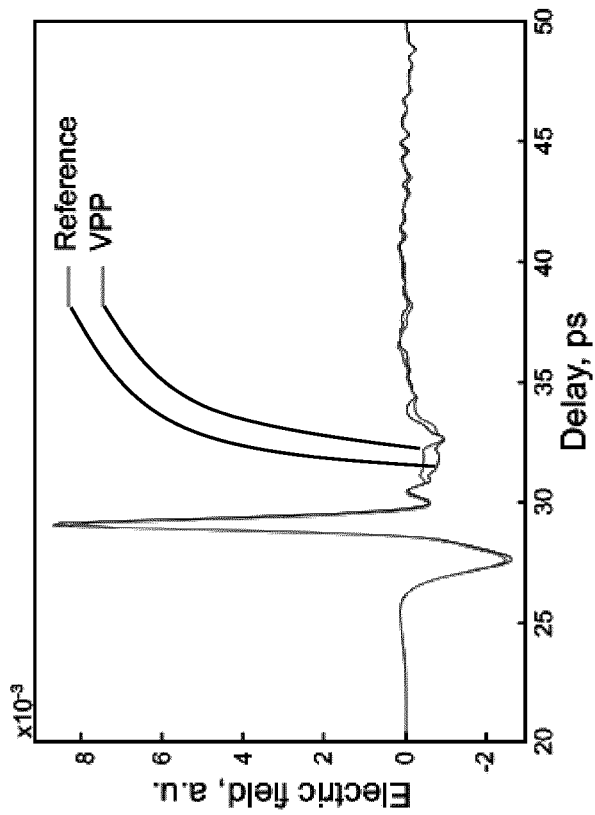
FIG. 18A is a graph showing time-domain spectra of the vortex phase plate of FIG. 17 and its reference obtained using the THz-TDS of FIG. 16.

To obtain the THz transmission value of the VPP sample, two THz pulses were acquired in the time domain, i.e., the reference ($E_{ref}$(t)) and the sample ($E_{sam}$(t)) signals, as shown in FIG. 18A. An unpatterned PET substrate served as a reference. The normalized transmission T($\omega$) was obtained in the frequency domain using the following relation:

$$T(\omega) = \left| \frac{E_{ref}(\omega)}{E_{sam}(\omega)} \right|. \tag{1}$$

The vortex beam retained its shape after propagating through a homogeneous medium or at the focus of a lens. This point is crucial in order to still be able to retrieve the transmission dip at vortex frequency using a single pixel detector (i.e., at the focus of a photoconductive THz detector).

The analysis of THz-TDS data via normalized amplitude in the frequency domain required two THz measurements: reference and signal, respectively. Unfortunately, these measurements are sensitive to environmental conditions, which could induce some unwanted variations between each subsequent measurement. For spectroscopic methods in the visible and ultraviolet range, such unwanted fluctuations are often avoided by a dual wavelength measurement approach. The principle is simple: simultaneously measuring at two wavelengths (reference and signal) and recording the difference values at these wavelengths, also called balanced measurement. This method has been used in the medical field to extract the concentration of drugs in tablets using UV radiation. The idea of such methods is to find an intensity dependence ratio between the active element (signal) and the matrix (reference). After a proper calibration, this value is directly proportional to the concentration of an element of interest.

Conventional photoconductive THz antennas emit THz radiation that covers a broad range of frequencies, e.g., typically from 100 GHz to 10 THz. Therefore, differentiating between two distinct signal frequencies, within the same pulse spectrum, is a straightforward manipulation. As shown in FIG. 18B, the process involves the extraction of a signal defined by a specific and narrowband range of frequencies, i.e., from $\omega_1$ to $\omega_2$, which exhibits a distinctive response proportional to the desired parameter (e.g., conductivity). A second frequency range, from $\omega_3$ to $\omega_4$, where no sign of absorption from the sample is detected, is used as reference information. The ratio between these two zones provides information about a transmission level corresponding to the parameter behavior under investigation. Since both signals are taken simultaneously, the noise from the ambient condition is suppressed in the normalization process:

$$I = \frac{\int_{\omega 1}^{\omega 2} |E_{sam}(\omega)|d\omega}{\int_{\omega 3}^{\omega 4} |E_{sam}(\omega)|d\omega'}, \quad (2)$$

where I is the value of ratio and $|E_{sam}(\omega)|$ is the amplitude signal of the measured THz spectrum.

To validate the viability of characterizing printed electronics by electromagnetic THz waves, two conventional conductivity measurement techniques were used: a multimeter with two probes and the state-of-the-art four-point probe methods. In addition, AFM measurements were performed in the surface morphology. Using a conventional multimeter instrument (MM) and two microprobes (S-shaped tungsten micro-probe tips), the electrical conductivity of a print pattern can be extracted using the following equation:

$$\sigma = \frac{L}{RA_c}, \quad (3)$$

where $\sigma$ is the electrical conductivity, R is measured resistance, L and $A_C$ are the length and the cross-section area of a tested printed structure, respectively.

For higher precision, the four-point probe method (4PP) enables precise measurements of the electrical conductivity for a tiny sample within the area of the 4PP arrangement. To ensure a perfect match between our sample size and the 4PP tips, the spacing between probes was set to 100 μm (MCW-28-7188, GGB industries, Naples, Flor., USA). The measurement with 4PP provides a sheet resistance in which the conductivity value is extracted using the following equation:

$$\sigma = \frac{\ln 2}{\pi t R'}, \quad (4)$$

where the geometric factor $\ln 2/\pi$ describes the current rings emanating from the outer probe tips, t is the thickness of the patch and R is the measured sheet resistance.

To confirm the good agreement between the conductivity of the printed control bar and the conductivity value of the patch, the resistance of a V-shaped antenna with two microprobes (2MP) was measured and its conductivity has been determined using Equation (3). Finally, to ensure that the sintering speed was responsible for the changes in conductivity, the surface morphologies of the printed samples were characterized using the AFM (EnviroScope, Santa Barbara, Calif., USA) system in tapping mode.

Five VPP samples with different conductivities were characterized by the THz-TDS described above. The conductivity of each sample was controlled by varying the sintering time. One of the samples (non-sintered) was not sintered by the lamp, but was slightly sintered during the printing step, since the chuck was held at a constant temperature of 60° C. FIG. 3A illustrates the normalized transmission amplitude of the different VPP samples, which were obtained from Equation (1). A dip in the transmission is observed due to the generation of a vortex beam at 0.22 THz, as expected. As mentioned previously, a higher resonance response (i.e., which translates to a lower transmission at 0.22 THz) indicates a sample with higher electrical conductivity.

To validate the accuracy of THz sensing of vortex plates as a function of material conductivity, finite difference time domain (FDTD) simulations were performed using the Lumerical software. Linearly polarized waves and perfectly matched layer boundary conditions were used in the simulation.

Figure 19A:
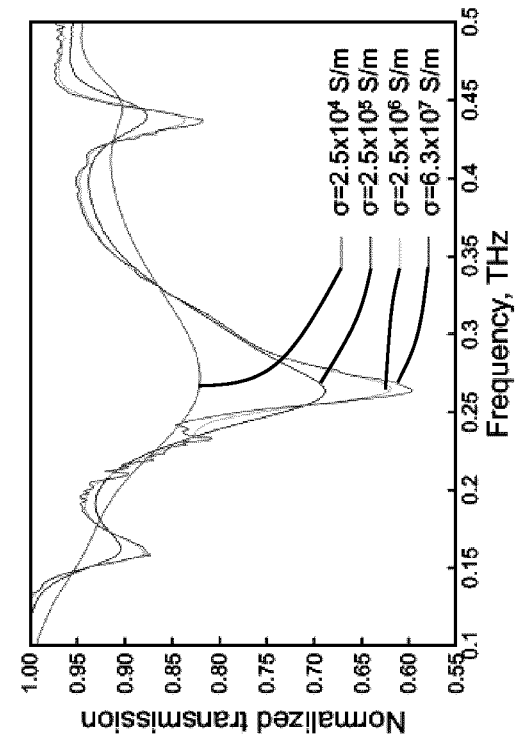
FIG. 19A is a graph showing normalized transmission spectra of the experimental results obtained with the THz-TDS of FIG. 16 for vortex phase plates having different conductivity values, in accordance with one or more embodiments.
Figure 19B:
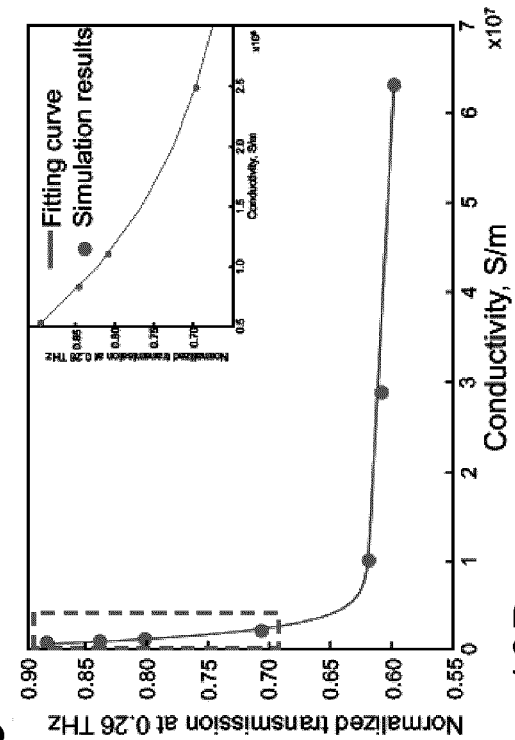
FIG. 19B is a graph showing simulated normalized transmission spectra with finite difference time domain (FDTD) method, in accordance with one or more embodiments.

FIG. 19B shows the simulated transmission spectra of VPPs with defined and uniform conductivities of a hypothetical printed metal. We placed VPP in the air in order to avoid Fabry-Perot resonances from the substrate. We can observe three transmission dips; the strongest one at 0.265 THz represents the central frequency of VPP. Compared to experiments, the red shift of the central frequency is explained by the absence of the PET substrate.

The simulation and experiment differ in the degree of transmission difference as a function of metal conductivity. This difference can be attributed to the perfect reading of the central vortex information in the simulated case. Essentially, the photoconductive antenna reads a spatially integrated range of information containing the central intensity part of a donut shaped beam, together with a large contribution from its wings. Nevertheless, the numerical simulations are in good agreement with experimental findings.

Figure 19C:
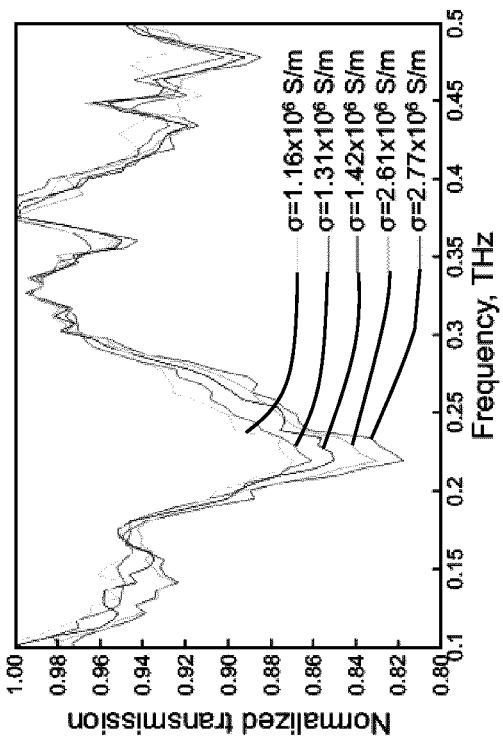
FIG. 19C is a graph showing conductivity values over time, the values being obtained using a two microprobes (2MP) measurement setup, the 4PP measurement setup, the THz-TDS of FIG. 16 and the DWTS receiver.
Figure 19D:
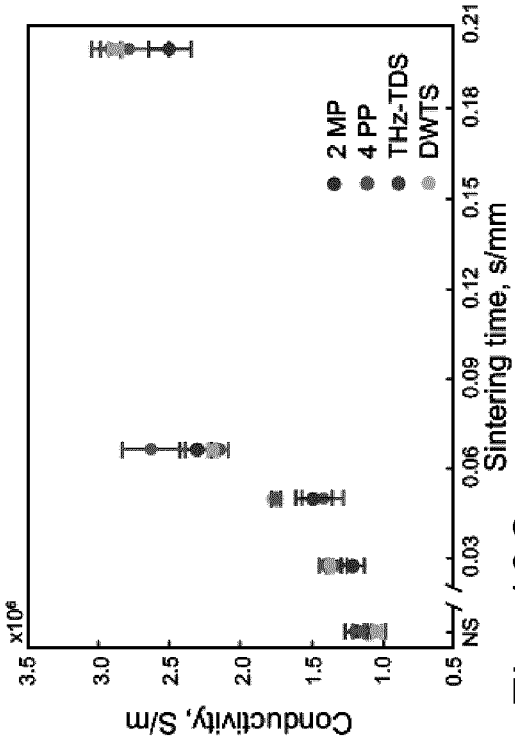
FIG. 19D is a graph showing simulated transmission amplitude at 0.26 THz as a function of conductivity, in accordance with one or more embodiments.

FIG. 19C gives the measured conductivity of five samples using three different methods: 2MP, 4PP, THz-TDS and DWTS as a function of sintering speed. The 4PP method was performed on the patch samples, while 2MP, THz-TDS and DWTS measurements provide the corresponding conductivity results from the VPP samples. The function of the value of the dip in transmission against the conductivity of VPP was also simulated, as shown in FIG. 19D. It is important to note that this function clearly reveals the extremely high sensitivity of THz wave sensing for low conductivity samples (e.g., below $1\times10^7$ S/m, the blue dotted region in inset). Above this conductivity value, the dip in transmission exhibits less sensitivity, with an almost saturated behavior (i.e., closer to a perfect metal resonance).

To compare the performance of THz-TDS and 4PP, the THz transmission amplitudes at 0.22 THz were calibrated to the expected conductivity values obtained from 4PP. Since the 4PP measurements cover a limited range of conductivity, from $1\times10^6$ to $3\times10^6$ S/m, a simple calibration using a linear fit was chosen (in agreement with inset of FIG. 19D, with the non-sintered sample as the starting point. In FIG. 19C, the similar increases in conductivity behavior as a function of sintering exposure time for the measurements taken by THz-TDS and 4PP is observed. More importantly, all sintering conditions are well discriminated by THz measurements, whereas 4PP failed in differentiating the three lowest conductivity conditions (i.e., <$1.5\times10^6$ S/m), as well as the two highest conductivity conditions (i.e., >$2.5\times10^6$ S/m). In addition, we repeated the measurements ten times for each method and calculated the standard deviation. Interestingly, THz-TDS exhibits better repeatability than the conventional 4PP method. This difference can be attributed to the contactless nature of the THz method: 4PP can locally damage the ink surface and may render repeated measurement less accurate.

In the second step, using the data obtained from THz-TDS measurements, the sample signal was analyzed using the DWTS method. The two frequency ranges were 0.195-0.244 THz and 0.615-0.664 THz, for the signal and reference, respectively (see FIG. 18B). In order to perform the measurement in ambient conditions, the reference frequency range was chosen to avoid the water absorption lines that can occur due to ambient humidity. Similarly to THz-TDS transmission data, the integral values from DWTS were normalized and calibrated with respect to the retrieved conductivity using the 4PP method. The behavior follows the expected static conductivity, but more importantly, the repeatability is four times better than the conventional 4PP method.

Figure 20:
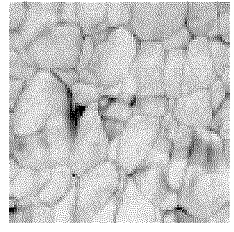
FIG. 20 is a table comparing conductivity measurements performed using the THz-TDS of FIG. 16 and other conventional techniques.
Figure 20:
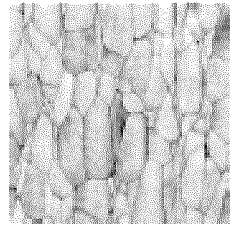
Figure 20:
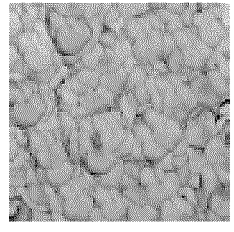
Figure 20:
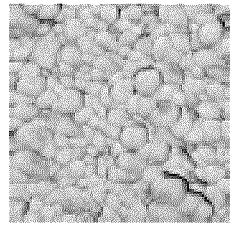

In a final step, the analysis done was reviewed on the patch versus VPP samples using the various methods described previously. The table presented in FIG. 20 summarizes the obtained results. In this table, 4PP denotes four-point probe measurements, MM denotes multimeter measurements, 2MP denotes two microprobes measurements, THz-TDS denotes terahertz time-domain spectroscopy measurements, DWTS denotes dual-wavelength terahertz spectroscopy measurements and AFM denotes atomic force microscopy measurements. The scale of atomic force microscopy (AFM) images is the same for all figures shown in this example.

In order to establish a comparative measurement performance, several resistance measurements were carried out at different locations for the patch and V-shaped antenna and present their relative standard deviation (RSD). As mentioned previously, the 4PP and multimeter retrieved the resistance on the patch. To clearly validate that VPP conductivity is linked to the patch conductivities, 2MP were also used to evaluate the VPP resistance directly. It has to be mentioned that, due to the extremely small effective volume of VPP unit cell, the 2MP method can easily over- or underestimate the conductivity (e.g., conductivity dependency on sample volume, as shown in Equation (3)). However, the 2MP measurements confirmed the good agreement between the sintering exposure time for the patch and VPP samples together. In order to confirm the provided conductivity measurements, the evolution of the sintering of Ag ink was studied using AFM analysis at five different sintering stages. The last row of this table depicts the printed ink surfaces after sintering. The non-NIR-sintered sample (NS) showed poor contact between Ag NPs, resulting in the lowest conductivity ($1.15 \times 10^6$ S/m). The sample with the shortest annealing time (0.03 s/mm) depicted the next stage of the sintering, necks began to grow between NPs prompted by surface energy minimization. With a longer annealing time of 0.05 s/mm, the NPs get more compact and the printed structure densifies. The slight increase of annealing time to 0.07 s/mm led to a further increase in conductivity. The longest annealing time (0.2 s/mm) led to the highest density and the highest conductivity ($2.77 \times 10^6$ S/m). According to AFM observations of the surface morphology of the samples, the obtained samples were consistent with the sintering parameters and measurements of the conductivity with different techniques.

As can also be seen in the table of FIG. 20, as expected, the measurements provided by a conventional multimeter were the least precise since the probes of the multimeter easily break the surface of the patch after contact. Meanwhile, the micro-probe provides a safer way to avoid destroying the sample surface. The average conductivities measured with the different techniques are in the same range, and have similar behavior as a function of the sintering time. It should be emphasized that the trend in electrical static conductivity measurements on the printed patch and the VPP using the different techniques are all in good agreement. This confirms the feasibility of characterizing the variability in ink conductivity during mass production of PE devices simply by reading a test structure. Finally, the best RSD for repeatability was obtained for DWTS and THz-TDS.

In conclusion, a quality control bar was developed for industrial production of PE devices based on a VPP working in the THz range. The VPP was formed from V-shaped antennas with a central frequency at 0.220 THz. The samples were printed with commercially available ink consisting of silver nanoparticles, and a commercial inkjet printer was used for the fabrication. The conductivities of the printed samples were varied by changing the speed of a near-infrared heater. THz-TDS was employed to analyze the transmission properties of printed VPP. The results showed that the THz transmission response of a resonant sample enables to follow the changes in sintering condition of the printed ink. The results were validated with a simulation study and introduced DWTS as a simple and fast method to quickly determine the transmission response of VPP. This example also confirms the similar conductivity behavior between adjacent printed structures and VPP sample as function of sintering exposure time. This important observation enables to track the changes in sintering process of PE devices during the manufacturing process using a simple control bar.

Finally, using the conventional four-point-probe method as a reference, it is confirmed that a calibrated quality control bar in the shape of the VPP, or any other resonant metamaterial structure printed on the substrate using the ink to qualify, could be used to determine the static electrical properties of non-resonant printed devices that are printed simultaneously with the VPP samples. Being a non-contact method, it is highly suitable for in-line characterization of high-speed roll-to-roll printing repeatability of PE devices.

As can be understood, the examples described above and illustrated are intended to be exemplary only. For instance, the printed electronic device can by any suitable type of electronic device including, but not limited to, flexible displays, curved smartphones, blood glucose tests, antennas, freshness sensors, solar cells, e-boards and the like. Moreover, the printing techniques can include, but not limited to, screen printing, flexography printing, gravure printing, offset lithography printing, inkjet printing, digital aerosol jet printing, laser printing, electrohydrodynamic jet printing, sintering (e.g., thermal sintering, laser sintering, UV sintering) and the like. The scope is indicated by the appended claims.

What is claimed is:

1. An electronic device testing system for testing an electronic device having a substrate on which is printed a metamaterial structure using an ink, the electronic device testing system comprising:
   a terahertz radiation emitter configured to emit an incident terahertz radiation beam to be incident on the metamaterial structure of the substrate, the incident terahertz radiation beam having power at least the terahertz resonance frequency of the metamaterial structure;
   a terahertz radiation receiver configured to receive an outgoing terahertz radiation beam outgoing from the metamaterial structure and to measure an amplitude of an electric field of the outgoing terahertz radiation beam at least at the terahertz resonance frequency; and a controller configured to determine a conductivity value indicative of a conductivity of the ink based on said amplitude and to generate a signal indicative of an action to be performed when the determined conductivity of the ink is below a given conductivity threshold.

2. The electronic device testing system of claim 1, wherein the terahertz radiation emitter is a broadband terahertz radiation emitter, the terahertz radiation receiver being configured to measure a spectral power distribution of the outgoing terahertz radiation beam, the system further comprising a broadband terahertz radiation reference receiver configured to measure a spectral power distribution of a portion of the incident terahertz radiation beam, the controller being configured to determine the conductivity value based on the spectral power distribution of the incident terahertz radiation beam and on the spectral power distribution of the outgoing terahertz radiation beam.

3. The electronic device testing system of claim 1 wherein the terahertz radiation emitter is a broadband terahertz radiation emitter, the terahertz radiation receiver being configured to measure a spectral power distribution of the outgoing terahertz radiation beam, the controller being configured to determine the conductivity value based on an amplitude of a first spectral region including the terahertz resonance frequency and on an amplitude of a second spectral region being spectrally spaced-apart from the first spectral region.

4. The electronic device testing system of claim 1 wherein the metamaterial structure is provided in the form of a vortex phase plate.

5. The electronic device testing system of claim 4 wherein the terahertz radiation receiver is a terahertz radiation image receiver, the controller being configured to determine the conductivity value based on an amplitude of the electric field of the outgoing terahertz radiation beam at a central region thereof.

6. The electronic device testing system of claim 5 wherein the terahertz radiation emitter and the terahertz radiation receiver are complementary metal-oxide-semiconductor devices, the electronic device testing system being portable.

7. An electronic device production system comprising:
an electronic device printing system configured to print an electronic device including receiving a substrate, printing an electronic circuit on a given area of the substrate using an ink and printing a metamaterial structure on a remaining area of the substrate using the ink, the metamaterial structure comprising a pattern of elements providing a terahertz resonance frequency to the metamaterial structure; and an electronic device testing system being adapted to receive the previously printed substrate, the electronic device testing system comprising a terahertz radiation emitter configured to emit an incident terahertz radiation beam to be incident on the metamaterial structure of the substrate, the incident terahertz radiation beam having power at least at the terahertz resonance frequency of the metamaterial structure, a terahertz radiation receiver configured to receive an outgoing terahertz radiation beam outgoing from the metamaterial structure and to measure an amplitude of an electric field of the outgoing terahertz radiation beam at least at the terahertz resonance frequency; and a controller configured to determine a conductivity value indicative of a conductivity of the ink based on said amplitude and to generate a signal indicative of an action to be performed when the determined conductivity of the ink is below a given conductivity threshold.

8. The electronic device production system of claim 7 wherein said action includes generating a file indicating that the electronic device has been printed with ink having a conductivity value being below the given conductivity threshold.

9. The electronic device production system of claim 7 wherein said action includes modifying at least one printing parameter of said electronic device printing system.

10. The electronic device production system of claim 8 wherein said action includes one of partially and wholly reprinting the electronic circuit of the electronic device after said modifying.

11. A method for testing an electronic device having an electronic circuit being printed on a given area of a substrate using an ink and a metamaterial structure being printed on a remaining area of the substrate, the metamaterial structure comprising a pattern of elements providing a terahertz resonance frequency to the metamaterial structure using the ink, the method comprising:
emitting a terahertz radiation emitter incident on the metamaterial structure of the substrate, the incident terahertz radiation beam having power at least at the terahertz resonance frequency of the metamaterial structure, thereby causing an outgoing terahertz radiation beam to be outgoing from the metamaterial structure;

the metamaterial structure modifying a first spectral power distribution of the incident terahertz beam and thereby causing an outgoing terahertz radiation beam to have a second spectral power distribution being different from the first spectral power distribution;

measuring an amplitude of an electric field of the outgoing terahertz radiation beam at least at the terahertz resonance frequency; and using a controller being communicatively coupled to at least the terahertz radiation receiver, determining a conductivity value indicative of a conductivity of the ink based on said amplitude.

12. The method of claim 11, wherein the incident terahertz radiation beam is a broadband terahertz radiation beam, said measuring including measuring a spectral power distribution of the outgoing terahertz radiation beam, the method further comprising measuring a spectral power distribution of a portion of the incident terahertz radiation beam, said determining including determining the conductivity value based on the spectral power distribution of the incident terahertz radiation beam and on the spectral power distribution of the outgoing terahertz radiation beam.

13. The method of claim 11 wherein the terahertz radiation beam is a broadband terahertz radiation beam, said measuring including measuring a spectral power distribution of the outgoing terahertz radiation beam, said determining comprising determining the conductivity value based on an amplitude of a first spectral region including the terahertz resonance frequency and on an amplitude of a second spectral region being spectrally spaced-apart from the first spectral region.

14. The method of claim 11 wherein the metamaterial structure is provided in the form of a vortex phase plate, said measuring including measuring an image of the outgoing terahertz radiation beam, said determining comprising determining the conductivity value based on an amplitude of the electric field of the outgoing terahertz radiation beam at a central region thereof.

15. The method of claim 11 further comprising, upon determining that the conductivity value is lower than a conductivity value threshold, generating a signal indicative of an action to be performed.

16. The method of claim 15 wherein said action including generating a file indicating that the electronic device has been printed with unsatisfactory ink.

17. The method of claim 11 further comprising, upon determining that the conductivity value is lower than a conductivity value threshold, updating current printing parameters to updated printing parameters based on said determined conductivity value.

18. The method of claim 17 further comprising reprinting the electronic circuit on the given area of the substrate based on said updated printing parameters.

19. The method of claim 11 further comprising printing the metamaterial structure on the remaining area of the substrate using the ink.

\* \* \* \* \*